United States Patent [19]
Hirata et al.

[11] Patent Number: 5,949,097
[45] Date of Patent: Sep. 7, 1999

[54] SEMICONDUCTOR DEVICE, METHOD FOR MANUFACTURING SAME, COMMUNICATION SYSTEM AND ELECTRIC CIRCUIT SYSTEM

[75] Inventors: Koji Hirata, Kodaira; Tomonori Tanoue, Machida; Hiroshi Masuda, Higashimurayama; Hiroyuki Uchiyama, Kodaira; Kazuhiro Mochizuki, Suginami-ku, all of Japan

[73] Assignees: Hitachi, Ltd.; Hitachi ULSI Engineering Co., both of Tokyo, Japan

[21] Appl. No.: 08/932,939

[22] Filed: Sep. 17, 1997

Related U.S. Application Data

[63] Continuation-in-part of application No. PCT/JP95/00485, Mar. 17, 1995.

[51] Int. Cl.⁶ .......................... H01L 29/04; H01L 29/737
[52] U.S. Cl. ......................... 257/198; 257/197; 257/67; 257/74
[58] Field of Search .................................. 257/197, 198, 257/67, 74

[56] References Cited

U.S. PATENT DOCUMENTS

| | | | |
|---|---|---|---|
| 4,758,896 | 7/1988 | Ito | 257/67 |
| 5,506,427 | 4/1996 | Imai | 257/198 |

FOREIGN PATENT DOCUMENTS 5-283433  10/1993  Japan.

OTHER PUBLICATIONS

Amamiya et al, IEDM Dec. 11, 1994 "Microwave in Layers" pp. 199–202.
National Technical Report vol. 39, No. 6, Dec. 1993, M. Yanagihara et al., "AlGaAs/GaAs Heterojunction Bipolar Transistor Operating at Low Voltages for Communication Systems".
Hayama et al., "Submicrometer Fully Self–Aligned AlGaAs/GaAs Heterojunction Bipolar Transistor", IEEE Electron Device Letters, vol. EDL–8, No. 5, May 1987.

*Primary Examiner*—Jerome Jackson, Jr.
*Attorney, Agent, or Firm*—Antonelli, Terry, Stout & Kraus, LLP

[57] ABSTRACT

The present invention relates to a contact structure not only for a semiconductor device having a hetero-junction bipolar transistor or a hetero-insulated gate field effect transistor but also for semiconductor devices at large. In a semiconductor layer of a polycrystalline or amorphous undoped III–V compound semiconductor or an alloy thereof, a through hole is formed for contact. The size of the through hole is set to permit exposure of at least part of a first conductor layer and a dielectric layer, such as an Si compound, present around the first conductor layer, and a second conductor layer is formed within the through hole so as to contact the first conductor layer. Since the semiconductor layer can be subjected to a selective dry etching for the dielectric layer, the dielectric layer is not etched at the time of forming the above through hole in the semiconductor layer. As a result an electric short-circuit of the second conductor layer with a single crystal semiconductor layer which underlies the dielectric layer can be prevented.

32 Claims, 21 Drawing Sheets

SEMICONDUCTOR DEVICE, METHOD FOR MANUFACTURING SAME, COMMUNICATION SYSTEM AND ELECTRIC CIRCUIT SYSTEM

The present application is a continuation-in-part application of prior PCT International Application No. PCT/JP95/00485, filed on Mar. 17, 1995.

TECHNICAL FIELD

The present invention relates to semiconductor devices at large, including bipolar transistors and field effect transistors, as well as a method for manufacturing the same.

BACKGROUND ART

A conventional hetero-junction bipolar transistor using a Group III–V compound semiconductor is described, for example, in National Technical Report Vol. 39 No.6 (Dec. 1993), pp. 729–735 (the first prior art). Its sectional structure is illustrated in FIG. 2(a). On a GaAs substrate 1 are formed a heavily doped n-type GaAs sub-collector layer 2, an n-type GaAs collector layer 3, a heavily doped p-type GaAs base layer 4, an n-type AlGaAs emitter layer 5, a heavily doped n-type InGaAs cap layer 6 for forming an ohmic contact, and a heavily doped n-type InGaAs layer 7. An emitter electrode 8, a base electrode 10 and a collector electrode 16 are formed on the exposed emitter layer, base layer and sub-collector layer, respectively. The reference numeral 38 denotes an area which has been rendered high in resistance by proton implantation. According to the structure of this device, the area of the emitter electrode is larger than that of an emitter electrode contact hole formed by an SiN layer 39 which is used for connection with a wiring metal 20.

Another example of a hetero-junction bipolar transistor using a Group III–V compound semiconductor is described in IEEE Electron Device Letters EDL-8 (1987), pp. 246–248 (the second prior art). Its sectional structure is illustrated in FIG. 2(b). On a GaAs substrate 1 are formed a heavily doped n-type GaAs sub-collector layer 2, an n-type GaAs collector layer 3, a heavily doped p-type GaAs base layer 4, an undoped GaAs base spacer layer 4', an n-type AlGaAs emitter layer 5, and a heavily doped n-type GaAs cap layer 6 for forming an ohmic contact. An emitter electrode 8, a base electrode 10 and a collector electrode 16 are formed on the exposed emitter layer, base layer and sub-collector layer, respectively. The reference numeral 9 denotes $SiO_2$ side walls, numeral 38 denotes an area which has been rendered high in resistance by proton implantation, and numeral 40 denotes an $SiO_2$ film. In this device, the outer periphery of mesa portion of the base layer 4 and collector layer 3 is of the same structure as the outer periphery of the base electrode 10.

Further, a conventional hetero-insulated gate field effect transistor is described, for example, in Japanese Patent Laid Open No. 283433/93 (the third prior art). The hetero-insulated gate field effect transistor indicates a gate field effect transistor of a structure in which a layer of a larger energy band gap than a channel layer is sandwiched in between the channel layer and a Schottky gate electrode. Its sectional structure is illustrated in FIG. 9. In the same figure, the numeral 26 denotes a single crystal semiconductor substrate, numeral 31 denotes a heavily doped n-type GaAs layer, numeral 28 denotes a channel layer comprising n-type GaAs layer, undoped AlGaAs layer and undoped GaAs layer, and numeral 24 denotes an insulating layer between $SiO_2$ layers. In this device, a low-resistance metal 37 is laminated onto a gate electrode 29 formed of WSi to reduce the gate resistance.

DISCLOSURE OF INVENTION

In order to attain a very high speed for a hetero-junction bipolar transistor, it is effective to diminish the base resistance, emitter-base capacitance and base-collector capacitance. The capacitances each increase in proportion to the junction area. For the reduction of capacitance, reducing the size of each pattern itself of the emitter, etc. and shortening of the distance between adjacent patterns are effective.

In the first prior art described above, however, it has been found that if the area of the emitter electrode 8 is made finer than the area of the emitter electrode contact hole, the base electrode 10 is exposed by etching at the time of forming the emitter electrode contact hole and that a short-circuit between the emitter and the base is caused by the wiring metal 20. Thus, a limit is encountered in the reduction of emitter-base and base-collector parasitic capacitance by reducing the size of the device.

In the second prior art described above it has been found that if the outer periphery of the mesa portion of the base layer 4 and collector layer 3 is made small, the base electrode area is also required to be made small, thus resulting in an increase of the base electrode resistance.

In the third prior art referred to above it has been found that at the time of etch back of the insulating layer 24 between $SiO_2$ layers for exposing the gate electrode 29, the etching of the insulating layer 24 proceeds to an excessive degree and reaches the source or drain region and that consequently the source or drain region and the gate electrode 29 are short-circuited when the low-resistance metal layer 37 is formed on the gate electrode 29.

It is the first object of the present invention to solve the problem of the short-circuit under the above-mentioned conditions with respect to semiconductor devices at large without the limiting solution to semiconductor devices having hetero-junction bipolar transistors and hetero-insulated gate field effect transistors. More specifically, it is the first object of the invention to provide a semiconductor device of a structure comprising a first conductor layer and a second conductor layer, the first conductor layer being formed on a single crystal semiconductor layer, with a first dielectric such as an Si alloy or an Si compound layer being formed on each side face of the first conductor layer, and the second conductor layer being formed on and in contact with the first dielectric Si alloy layer present around the first conductor layer. It is thereby intended to prevent an electric short-circuit between the second conductor layer and the single crystal semiconductor layer.

It is the second object of the present invention to reduce the area of the base mesa portion without an increase of the base electrode resistance in a semiconductor device having a hetero-junction bipolar transistor.

The first object mentioned above can be achieved by forming on the first dielectric Si alloy or Si compound layer a first semiconductor layer of a polycrystalline or amorphous undoped III–V compound semiconductor, or an alloy thereof, having a through hole to which is exposed at least part of the first conductor layer or the first dielectric Si alloy layer present around the first conductor layer, and then forming the second conductor layer within the through hole.

The first object can also be achieved by a semiconductor device manufacturing method comprising the steps of forming a first conductor layer on a single crystal semiconductor layer, forming a first dielectric Si alloy or Si compound layer on each side face of the first conductor layer so that the upper surface of the first conductor layer is exposed, forming on the first dielectric Si alloy or Si compound layer and the first conductor layer a first semiconductor layer of a polycrystalline or amorphous undoped III–V compound semiconductor or an alloy thereof and a second dielectric Si alloy or Si compound layer in this order, forming in the second dielectric Si alloy or Si compound layer a first through hole which reaches the first semiconductor layer in accordance with a selective dry etching method for the first semiconductor layer, using a reactive gas, forming in the first semiconductor layer a second through hole which reaches at least part of the first conductor layer and the first dielectric Si alloy or Si compound layer present around the first conductor layer, in accordance with a selective dry etching method for the first conductor layer and the first dielectric Si alloy or Si compound layer, using a reactive gas and using as an etching mask the second dielectric Si alloy or Si compound layer which has the first through hole, and forming a second conductor layer within a through hole constituted by the first and second through holes so as to contact the first conductor layer. Hereinafter, reference will be made only to Si alloy layers regarding the above noted first and second dielectric layers, with the understanding that Si compounds such as $SiO_2$ can also be used.

The foregoing second object of the invention can be attained by a semiconductor device having a structure of a bipolar transistor wherein sub-collector region, collector region, base region and emitter region are laminated in this order, the collector region and the base region being smaller than the sub-collector region, the emitter region being smaller than the collector region and the base region, further having a dielectric layer formed on the sub-collector, collector and base regions and having a through hole formed on the base region, a base lead-out semiconductor layer of the same conductivity type as the base region, the base lead-out semiconductor layer being formed in contact with the base region within the through hole of the dielectric layer, and a base electrode formed in contact with the base lead-out semiconductor layer and extending onto the dielectric layer.

The first semiconductor layer of a polycrystalline or amorphous undoped III–V compound semiconductor or an alloy thereof, which layer is introduced for achieving the foregoing first object, can undergo a selective dry etching between it and the first dielectric Si alloy layer, and therefore the first dielectric Si alloy layer is not etched when forming a through hole in the first semiconductor layer. Thus, it is possible to prevent an electric short-circuit between the second conductor layer and the single crystal semiconductor layer.

By introducing the second dielectric Si alloy layer, the wiring capacity can be decreased structurally, while from the standpoint of manufacture a step height on the device surface can be reduced, thus facilitating the formation of wire.

The first semiconductor layer becomes a polycrystalline or amorphous layer or a layer of an alloy thereof, depending on the layer forming temperature. From low to high layer forming temperatures there appear amorphous, mixed crystal, and polycrystal, in this order. Also at a sub-zero temperature it is possible to form the first semiconductor layer. The lower the layer forming temperature, the higher the resistivity of the first semiconductor layer. From this viewpoint the layer formation at a low temperature is desirable. In the low-temperature formation, however, the water content of the film becomes large, and therefore the lower limit of the layer forming temperature is determined while taking the film quality into account. As to the upper limit of the layer forming temperature, 400° C. or so is desirable taking the deterioration in characteristics of the device into account.

Further, if the etching selectivity between the semiconductor layer of a polycrystalline or amorphous III–V compound semiconductor or an alloy thereof and the dielectric Si alloy layer is utilized, there can be realized in high controllability a structure wherein the semiconductor layer having a through hole is formed on the dielectric Si alloy.

The structure with a dielectric layer formed under the base electrode, which is introduced for achieving the second object, permits reduction of the area of base mesa portion without causing an increase of the base electrode resistance because it is not required to reduce the base electrode area even when the base mesa region is made small. Besides, it is possible to diminish the base-collector capacitance.

BEST MODE FOR CARRYING OUT THE INVENTION

The present invention will be described in more detail hereinunder by way of working examples thereof.

EXAMPLE 1

Figure 1:
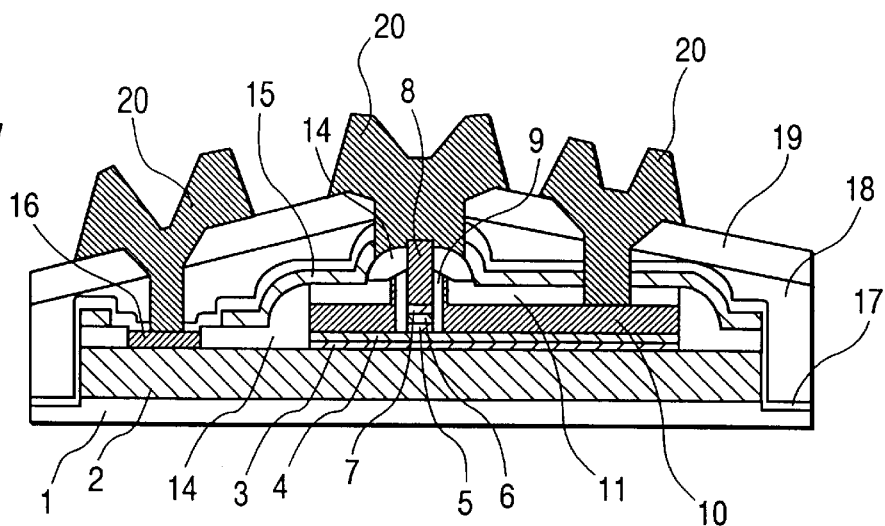
FIG. 1 is a structural sectional diagram of a hetero-junction bipolar transistor of Example 1 in the present invention.
Figure 2A:
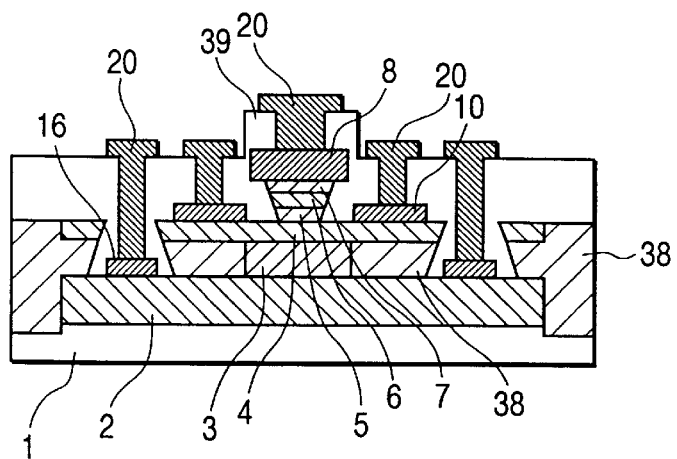
FIGS. 2(a) and (b) are structural sectional diagrams of conventional hetero-junction bipolar transistors.
Figure 2B:
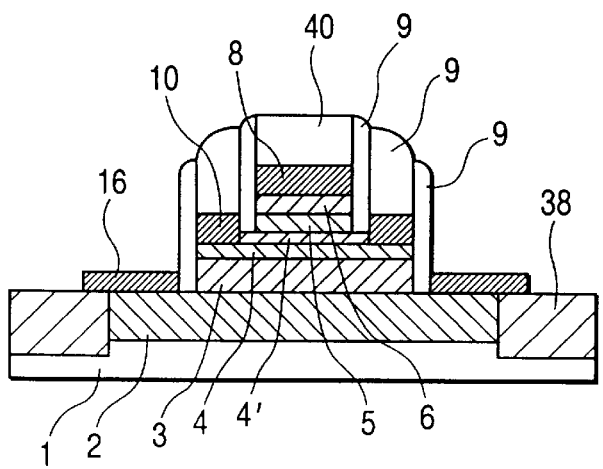

An AlGaAs/GaAs hetero-junction bipolar transistor in Example 1 of the present invention will be described below with reference to FIGS. 1 and 3. In this Example, an amorphous undoped GaAs layer 15 is formed in a dielectric interlayer area.

First, a heavily doped n-type GaAs sub-collector layer 2 (Si concentration $5\times10^{18}/cm^3$, thickness 500 nm), an n-type GaAs collector layer 3 (Si concentration $5\times10^{16}/cm^3$, thickness 150 nm), a heavily doped p-type GaAs base layer 4 (C concentration $4\times10^{19}/cm^3$, thickness 50 nm), an n-type AlGaAs emitter layer 5 (AlAs mole ratio 0.3, Si concentration $1\times10^{18}/cm^3$, thickness 50 nm), a heavily doped n-type GaAs cap layer 6 for forming an emitter ohmic contact (Si concentration $5\times10^{18}/cm^3$, thickness 150 nm), and a heavily doped n-type InGaAs cap layer 7 (Si concentration $5\times10^{18}/cm^3$, thickness 50 nm), were formed by epitaxial growth on a GaAs (100) substrate 1. Subsequently, W was deposited 600 nm and a W emitter electrode 8 having a width of 0.3 μm was formed by photolithography using a phase-shifting mask and ECR dry etching using a F-containing gas. Next, with the emitter electrode 8 as mask, the InGaAs cap layer 7, GaAs cap layer 6 and emitter layer 5 were subjected to an isotropic etching in accordance with the ECR method (gas ratio $Cl_2/CH_4$=7/3 sccm, etching pressure 36 mPa, μ wavepower 700 W, RF power 50 W, substrate temperature 25° C.) to expose the base layer 4. [FIG. 3(a)]

Then, $SiO_2$ side walls 9 (side-wall length 0.1 μm) were formed by the deposition of $SiO_2$ and dry etching. Subsequently, Pt, Ti, Mo, Ti, Pt, and Au, as materials of a base electrode 10 were deposited 300 nm in this order by directional evaporation, followed by deposition of $SiO_2$ film 11, application of photoresist 12a and planarization. [FIG. 3(b)]

Figure 3A:
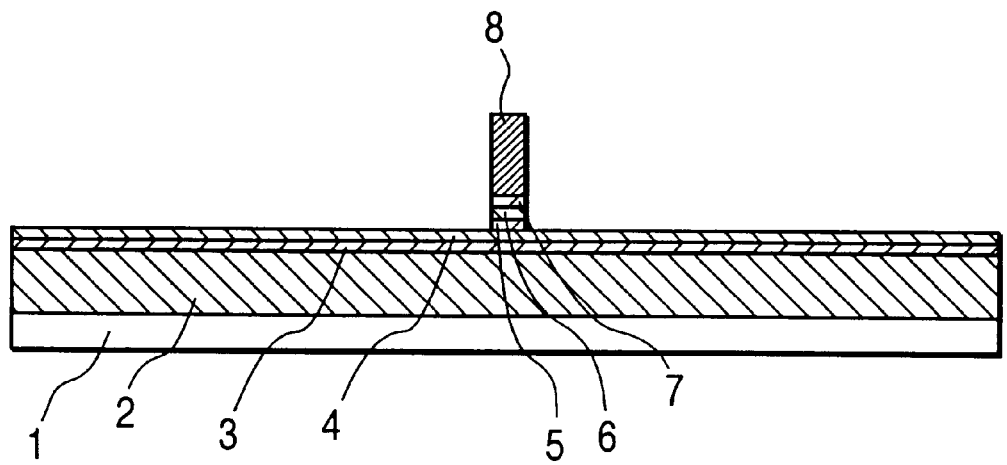
FIGS. 3(a) to 3(i) are manufacturing process diagrams for the hetero-junction bipolar transistor of Example 1.
Figure 3B:
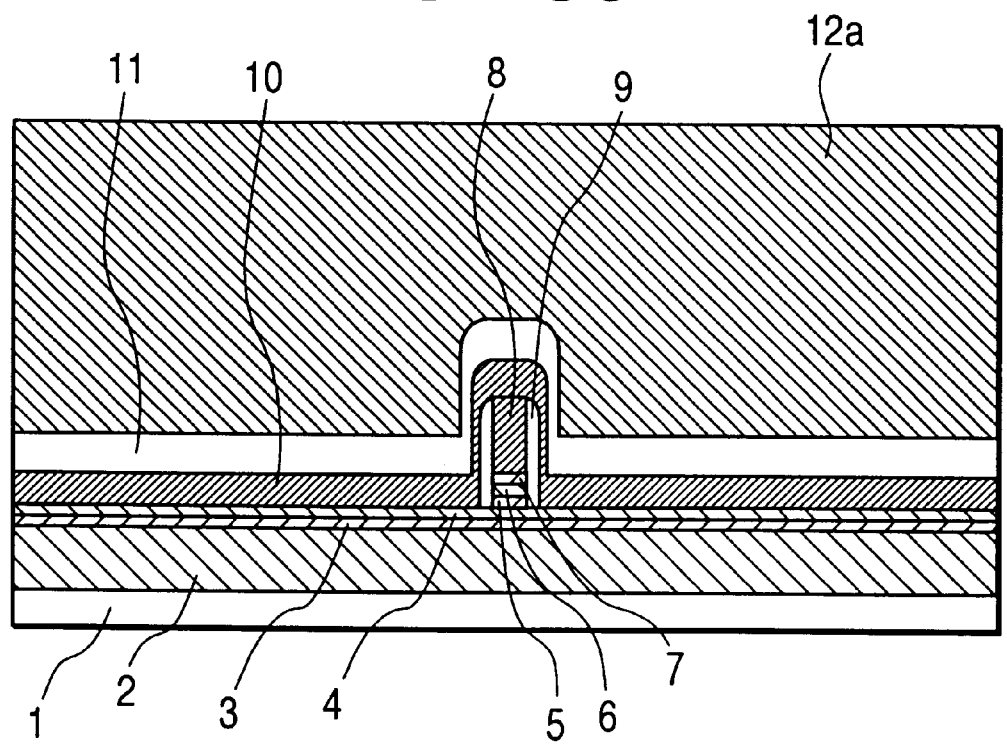
Figure 3C:
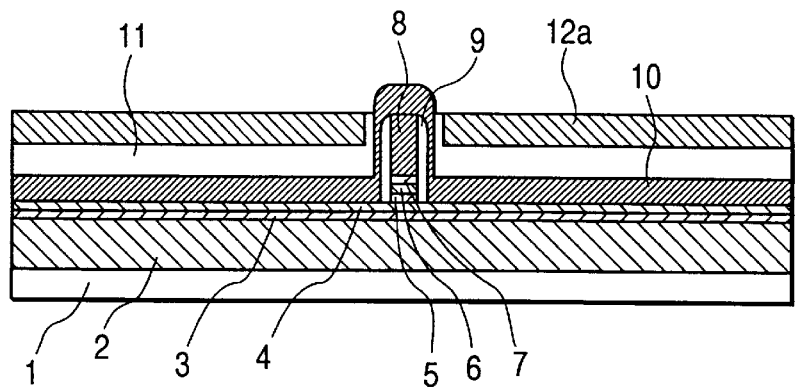

Thereafter, the photoresist 12a and the $SiO_2$ film 11 were etched back to expose a film of the materials for the base electrode 10 formed on the emitter electrode 8. [FIG. 3(c)]

Figure 3D:
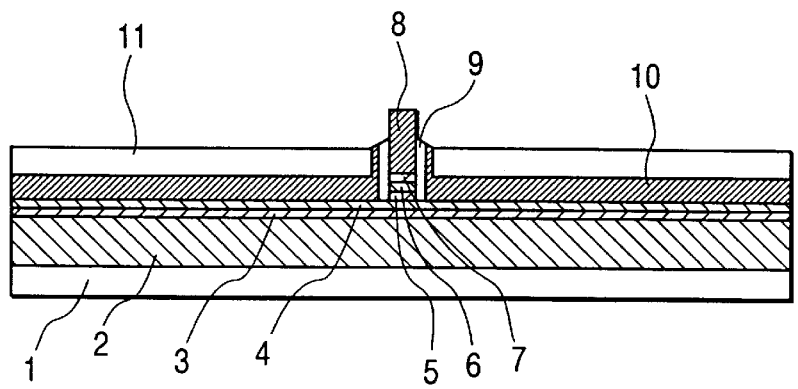
Figure 3E:
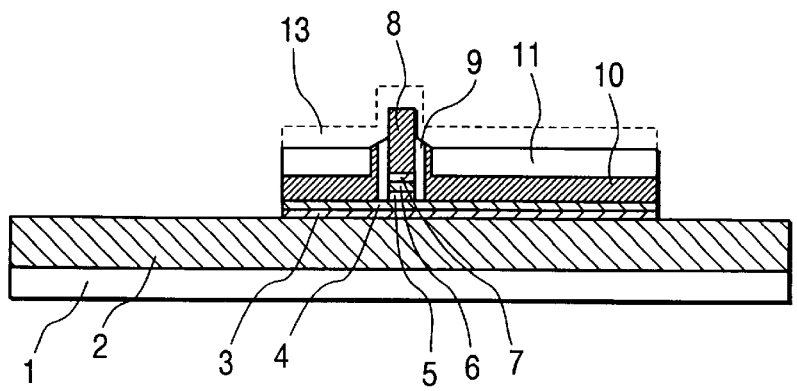
Figure 3F:
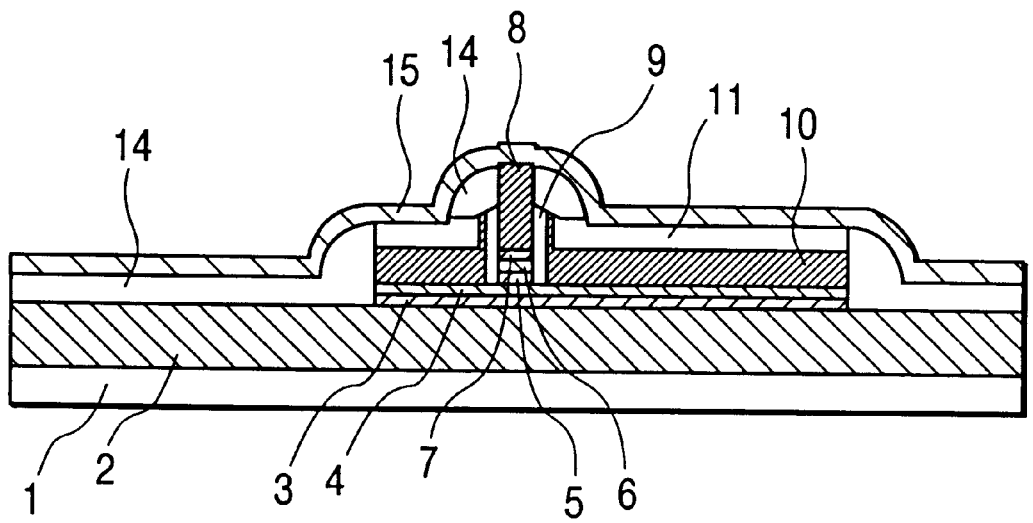
Figure 3G:
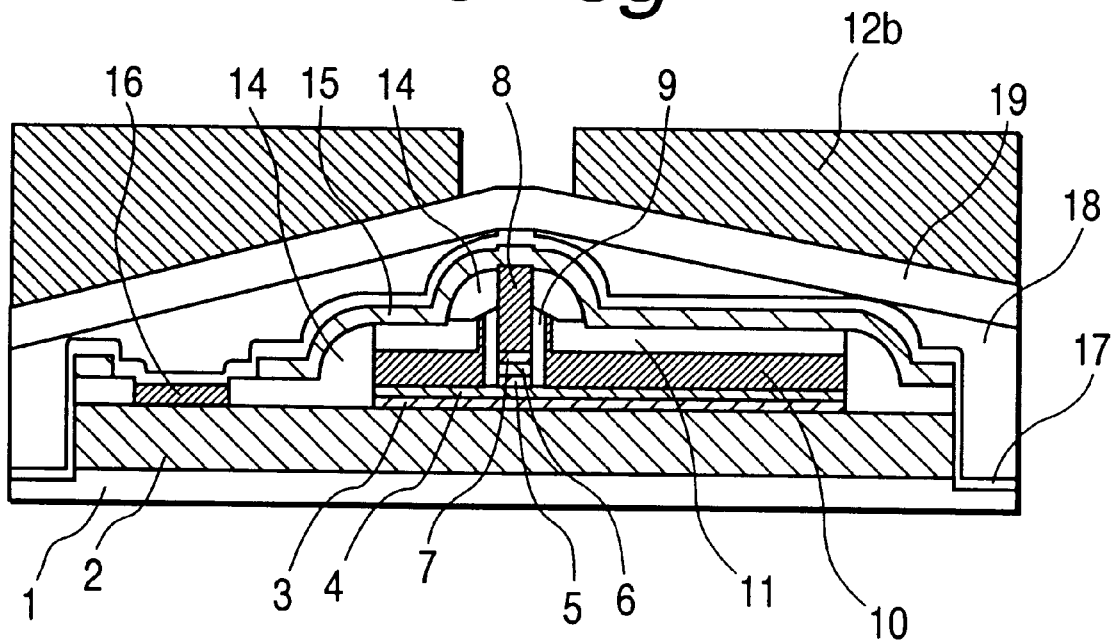
Figure 3H:
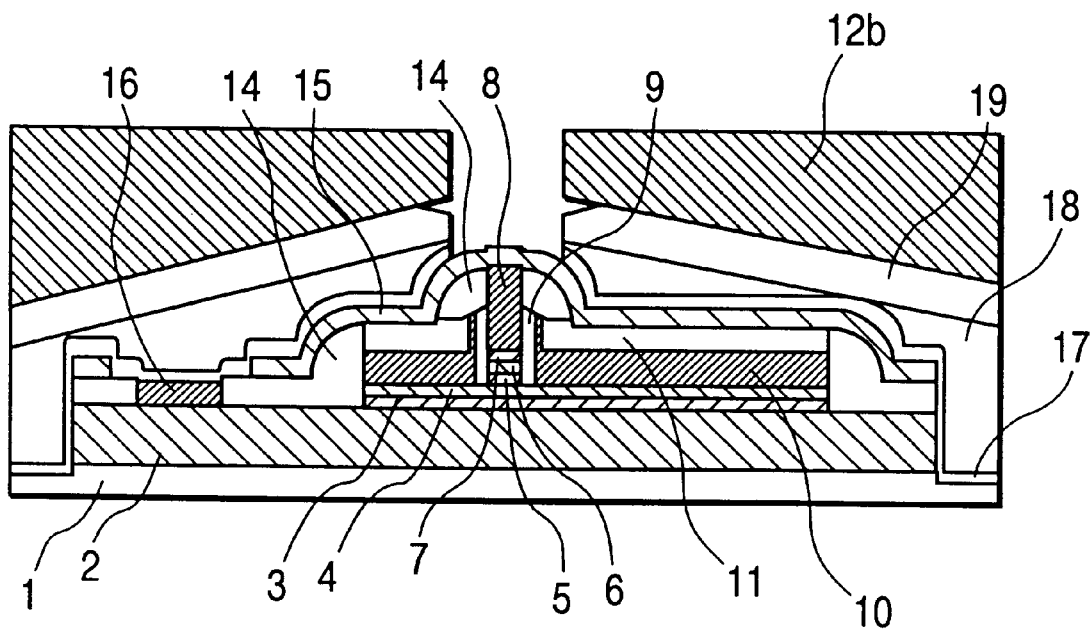

Next, the exposed film of the materials for the base electrode 10, including part of the portion deposited on side faces of the $SiO_2$ side walls 9, was ethced off by ion milling. [FIG. 3(d)]

Then, an Si compound such as an $SiO_2$ film pattern 13 was formed by the deposition of $SiO_2$ and dry etching using a photoresist as mask. Further, with the $SiO_2$ film pattern 13 as a mask, the base electrode 10, base layer 4 and collector layer 3 were subjected to ion milling to expose the subcollector layer 2. [FIG. 3(e)]

Subsequently, $SiO_2$ side walls 14 covering the exposed base electrode 10 were formed by the deposition of $SiO_2$ and dry etching. Then, within a molecular beam epitaxy system, undoped GaAs was deposited to a thickness of 50 nm at a substrate heating temperature of 120° C. The crystal structure of the resulting layer 15 was amorphous. [FIG. 3(f)]

Next, the sub-collector layer 2 was subjected to dry etching, allowing inter-device isolation to take place. Subsequently, an AuGe collector electrode 16 was formed by the lift-off method.

Thereafter, $SiO_2$ films 17, 18 and 19 were deposited successively to form a dielectric interlayer area, of which the $SiO_2$ film 18 is for diminishing the step height and was formed by coating. The $SiO_2$ films 17 and 19 serve to prevent the entry of water into the $SiO_2$ film 18. Next, there was formed a photoresist mask 12b for forming an emitter electrode contact hole. [FIG. 3(g)]

Then, using a mixed etching solution of HF and $H_2O$, the $SiO_2$ film 19 was subjected to isotropic etching. Subsequently, the $SiO_2$ film 19, coated $SiO_2$ film 18, and $SiO_2$ 17 were subjected to dry etching by the RIE method using $C_2F_6$ gas and $CHF_3$ gas in a selective and an isotropic manner for the undoped GaAs layer 15. [FIG. 3(h)]

Figure 3I:
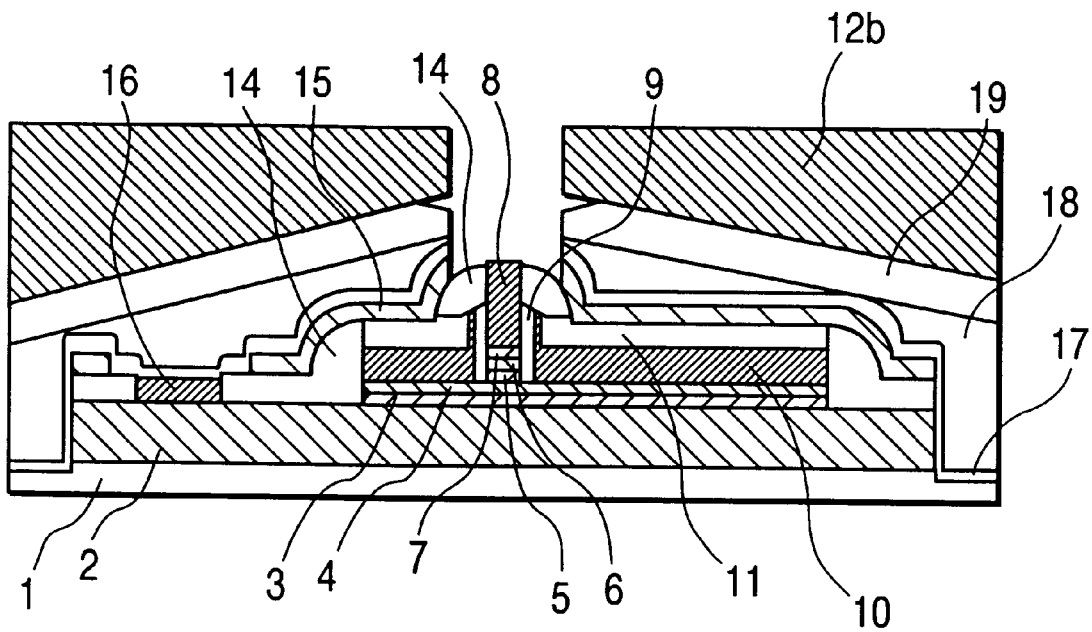

Next, the undoped GaAs layer 15 was subjected to dry etching by the ECR method using $SiCl_4$ gas in a selective and an isotropic manner for the $SiO_2$ film 14 and emitter electrode 8 to expose the upper surface of the emitter electrode 8. [FIG. 3(i)]

Likewise, also on the base electrode 10 and the collector electrode 16 was deposited wiring metal 20 after the formation of a contact hole, and then wiring was made by milling, to fabricate a hetero-junction bipolar transistor. (FIG. 1)

According to this Example, a hetero-junction bipolar transistor having an emitter area of 0.3 μm in width can be produced in high process yield. As a result, in comparison with the device having an emitter region width of 1 μm, the emitter-base parasitic capacitance can be diminished to about one third and the base-collector parasitic capacitance diminished to about two thirds, and it is possible to fabricate a super high-speed hetero-junction bipolar transistor having a maximum oscillation frequency about 1.2 times that of the conventional device.

EXAMPLE 2

An AlGaAs/GaAs hetero-junction bipolar transistor in Example 2 of the present invention will now be described with reference to FIG. 4. In this Example, an amorphous undoped GaAs layer 15 is formed in the dielectric interlayer area. Further, a heavily doped p-type GaAs layer 23 for suppressing the increase of the electrode contact resistance is formed between the base layer and the base electrode, and an $SiO_2$ layer 22 for decreasing the base-collector capacitance is formed in the parasitic collector portion included in the collector region.

First, a heavily doped n-type GaAs sub-collector layer 2 (Si concentration $5\times10^{18}/cm^3$, thickness 500 nm), an n-type GaAs collector layer 3 (Si concentration $5\times10^{16}/cm^3$, thickness 150 nm), a heavily doped p-type GaAs base layer 4 (C concentration $4\times10^{19}/cm^3$, thickness 50 nm), an n-type AlGaAs emitter layer 5 (AlAs mole ratio 0.3, Si concentration $1\times10^{18}/cm^3$, thickness 50 nm), an n-type GaAs cap layer 6 for forming an emitter ohmic contact (Si concentration $5\times10^{18}/cm^3$, thickness 150 nm), and a heavily doped n-type InGaAs cap layer 7 (Si concentration $5\times10^{18}/cm^3$, thickness 50 nm), were formed by epitaxial growth on a GaAs(100) substrate 1. Subsequently, W was deposited 600 nm and a W emitter electrode 8 having a width of 0.3 μm was formed by photolithography using a phase-shifting mask and ECR dry etching using an F-containing gas. Then, with the emitter electrode 8 as mask, the InGaAs cap layer 7, GaAs cap layer 6 and emitter layer 5 were subjected to an isotropic etching in accordance with the ECR method (gas ratio $Cl_2/CH_4$=7/3 sccm, etching pressure 36 mPa, μ wave power 700 W, RF power 50 W, substrate temperature 25° C.) to expose the base layer 4. [FIG. 4(a)]

Then, SiN sidewalls 21 (sidewall length 0.5 μm) were formed by the deposition of SiN and dry etching. Further, with the emitter electrode 8 and the SiN side walls 21 as mask, the base layer 4 and the collector layer 3 were subjected to ECR dry etching an isotropically to expose the sub-collector layer 2. Hereafter, $SiO_2$ film 22 was formed by deposition, followed by application of a photoresist 12c and planarization. [FIG. 4(b)]

Next, the photoresist 12c and the $SiO_2$ film 22 were etched back until the thickness of the $SiO_2$ film 22 was 300 nm. At this time, the base layer 4 is not exposed. [FIG. 4(c)]

Then, the SiN side walls 21 were etched to expose the base layer 4 by means of a plasma etching system and using an F-containing gas. Thereafter, $SiO_2$ side walls 9 were formed on the side faces of emitter portion 5, 6, 7, 8 and $SiO_2$ film 22 by the deposition of $SiO_2$ and dry etching. The $SiO_2$ side walls 9 are 0.1 μm long and the base layer 4 is exposed sufficiently. [FIG. 4(d)]

Next, the substrate was introduced into a metal-organic chemical vapor deposition system and selective epitaxial growth of a heavily doped p-type GaAs layer 23 (C concentration $4 \times 10^{20}/cm^3$, thickness 150 nm) was allowed to take place. Subsequently, Pt, Ti, Mo, Ti, Pt, and Au, as materials of a base electrode 10 were deposited 300 nm in this order by directional evaporation, followed by deposition of $SiO_2$ film 11, application of photoresist 12a and planarization.

Figure 4A:
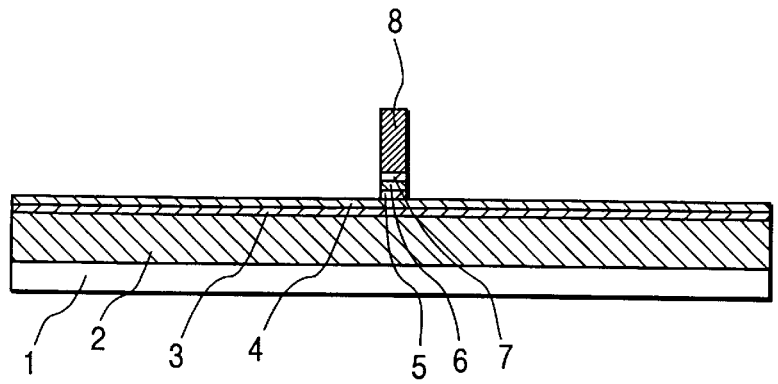
FIGS. 4(a) to 4(l) are manufacturing process diagrams for a hetero-junction bipolar transistor of Example 2 in the present invention.
Figure 4B:
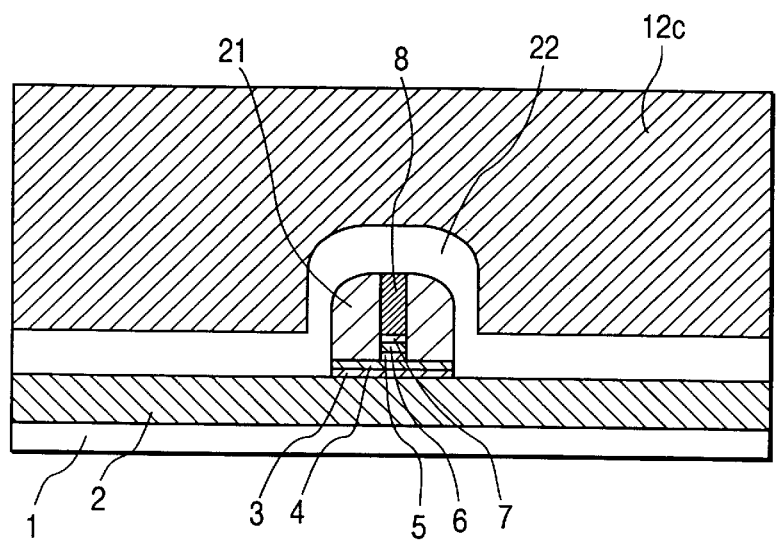
Figure 4C:
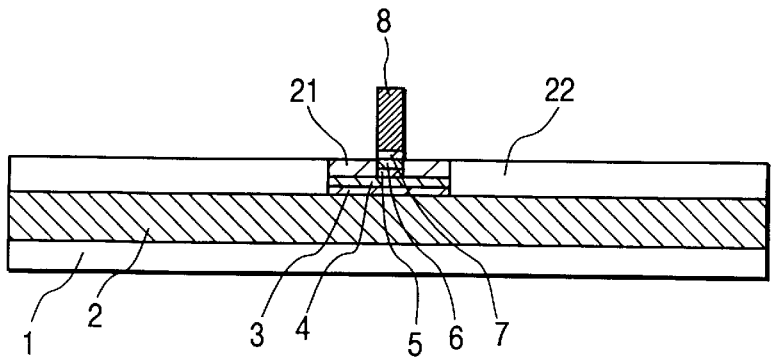
Figure 4D:
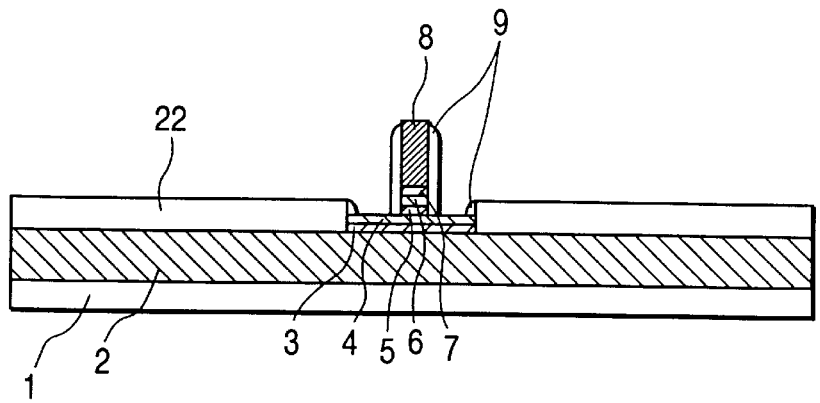
Figure 4E:
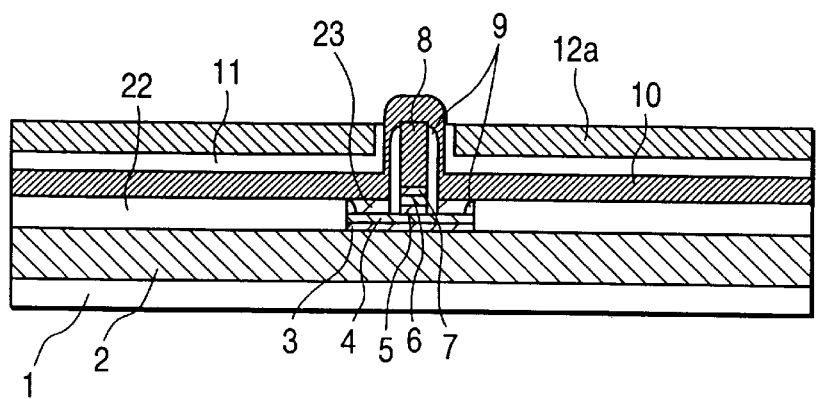

Thereafter, the photoresist 12a and the $SiO_2$ film 11 were etched back to expose a film of the materials for the base electrode 10 formed on the emitter electrode 8. [FIG. 4(e)]

Figure 4F:
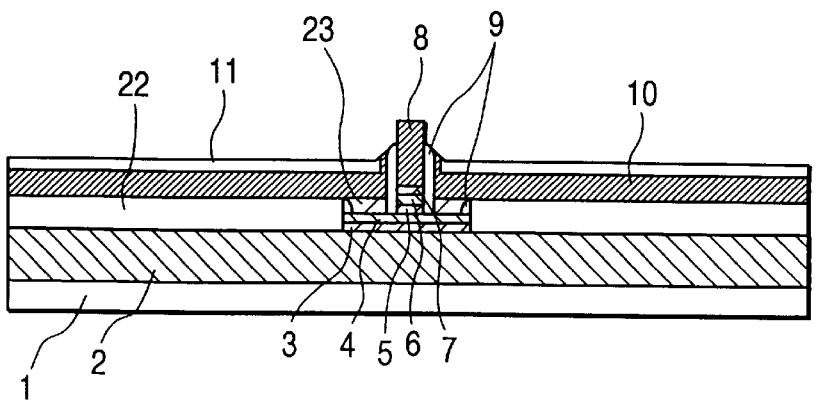
Figure 4G:
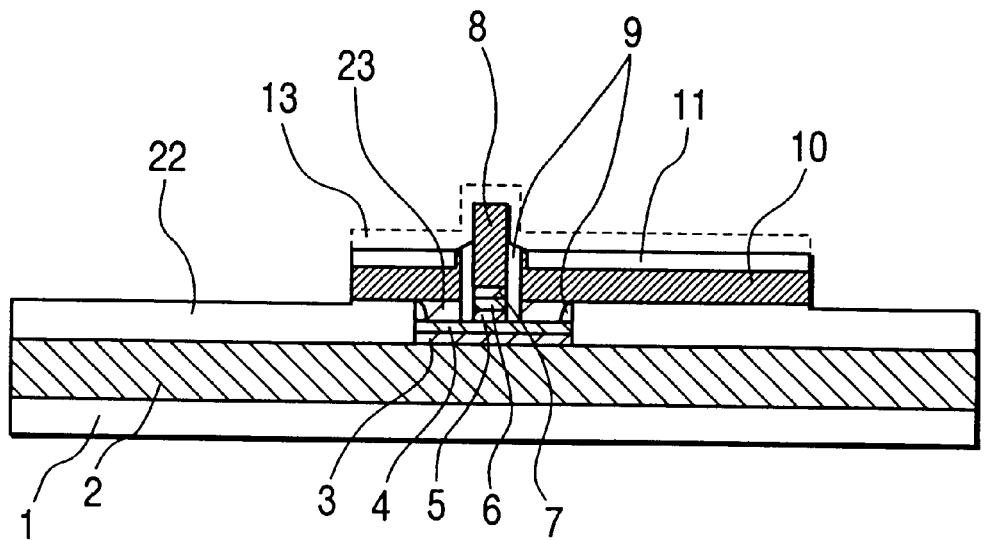
Figure 4H:
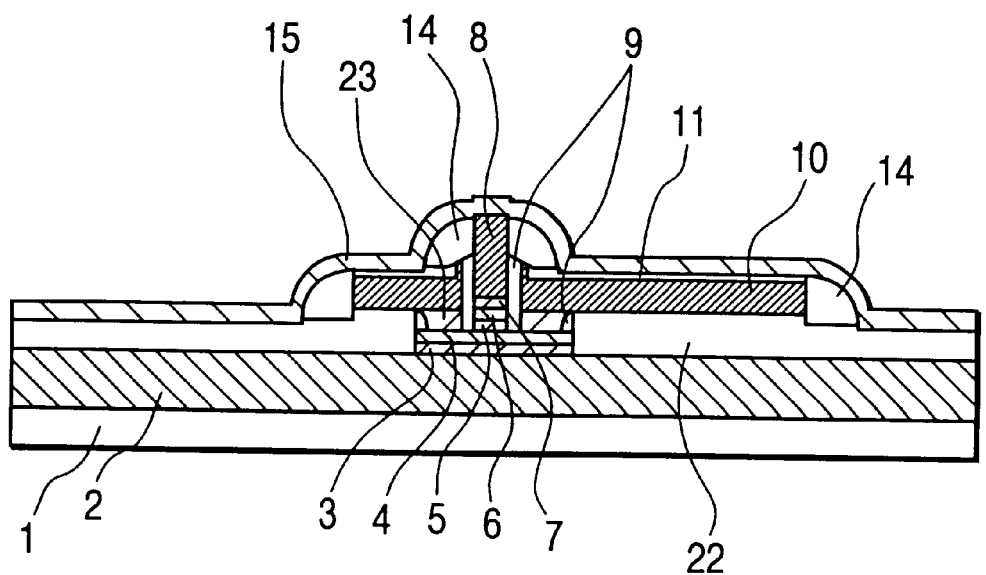

Next, the exposed film of the materials for the base electrode 10, including part of the portion deposited on side faces of the $SiO_2$ side walls 9, were etched off by ion milling. [FIG. 4(f)]

Then, an $SiO_2$ film pattern 13 was formed by the deposition of $SiO_2$ and dry etching using a photoresist as mask. Further, with the $SiO_2$ film pattern 13 as mask, the base electrode 10 was subjected to ion milling. [FIG. 4(g)]

Subsequently, $SiO_2$ side walls 14 covering the exposed base electrode 10 were formed by the deposition of $SiO_2$ and dry etching. Then, the substrate was introduced into a molecular beam epitaxy system and undoped GaAs was deposited to a thickness of 50 nm at room temperature without heating the substrate. The crystal structure of the resulting layer 15 was amorphous. [FIG. 4(h)]

Next, the sub-collector layer 2 was subjected to dry etching to effect inter-device isolation, followed by formation of an AuGe collector electrode 16 in accordance with the lift-off method. Thereafter, $SiO_2$ films were deposited successively to form a dielectric interlayer area. The $SiO_2$ was is for decreasing the step height and it was formed by coating. The $SiO_2$ films 17 and 19 serve to prevent the entry of water into the $SiO_2$ film. Then, a photoresist mask 12b for forming an emitter electrode contact hole was formed. [FIG. 4(i)]

Next, using a mixed etching solution of HF and $H_2O$, the $SiO_2$ film 19 was subjected to isotropic etching. Subsequently, the $SiO_2$ film 19, coated $SiO_2$ film 18 and $SiO_2$ film 7 were subjected to dry etching by the RIE method using $C_2F_6$ gas and $CHF_3$ gas in a selective and an isotropic manner for the undoped GaAs layer 15. [FIG. 4(j)]

Figure 4I:
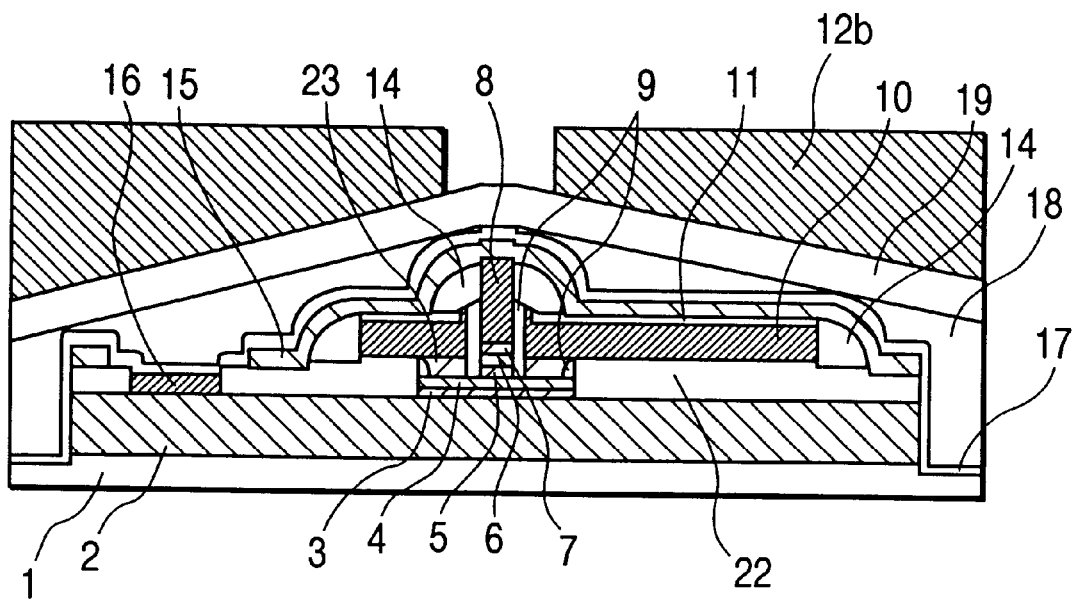
Figure 4J:
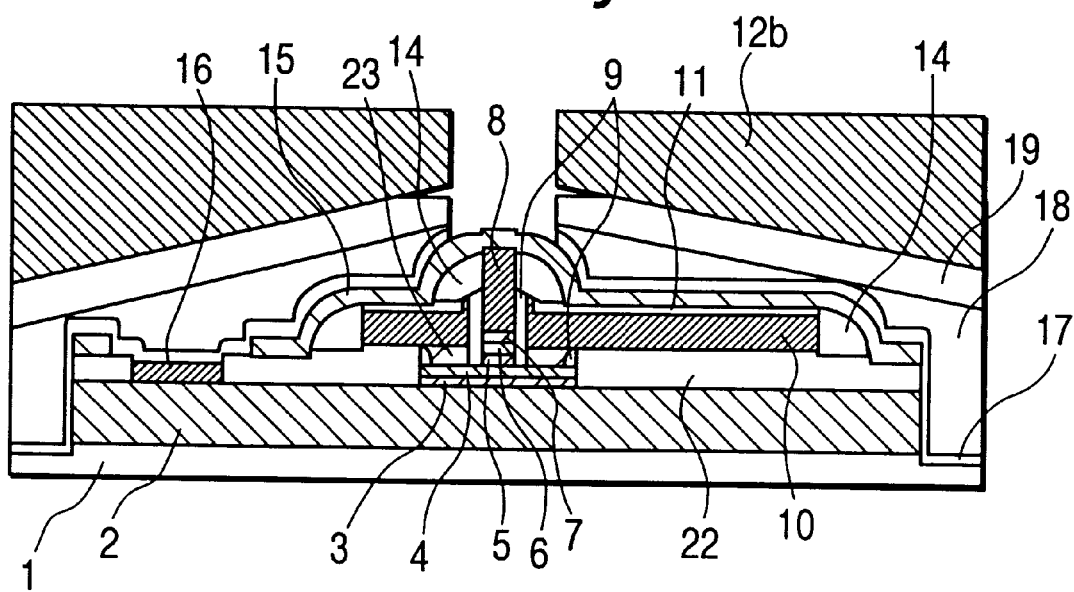
Figure 4K:
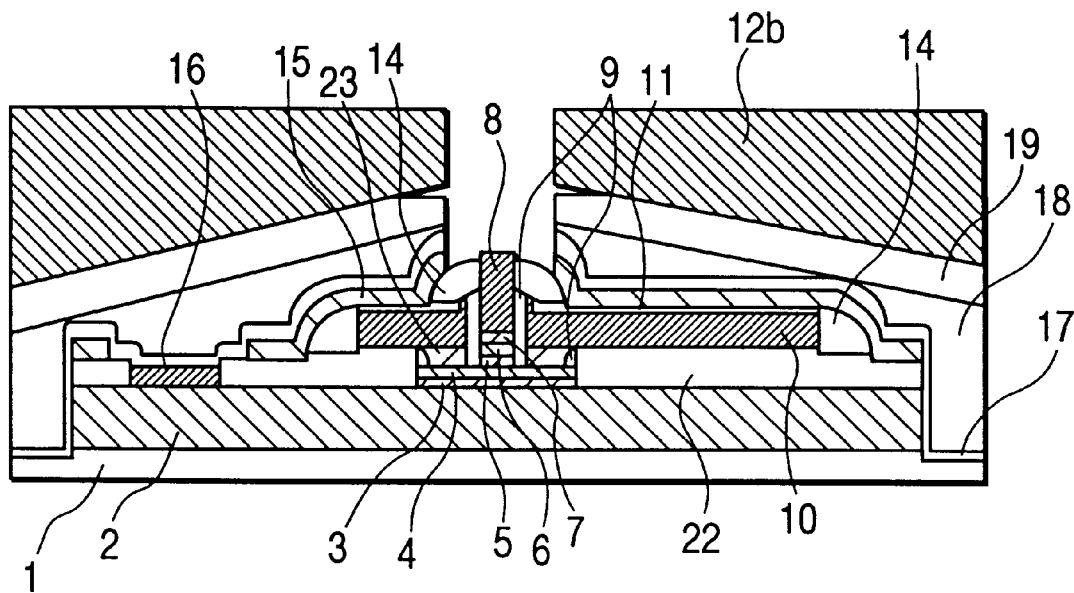

Then, the undoped GaAs layer 15 was subjected to dry etching by the ECR method using $SiCl_4$ gas in a selective and an isotropic manner for the SiO2 film 14 and emitter electrode 18. [FIG. 4(k)]

Figure 4L:
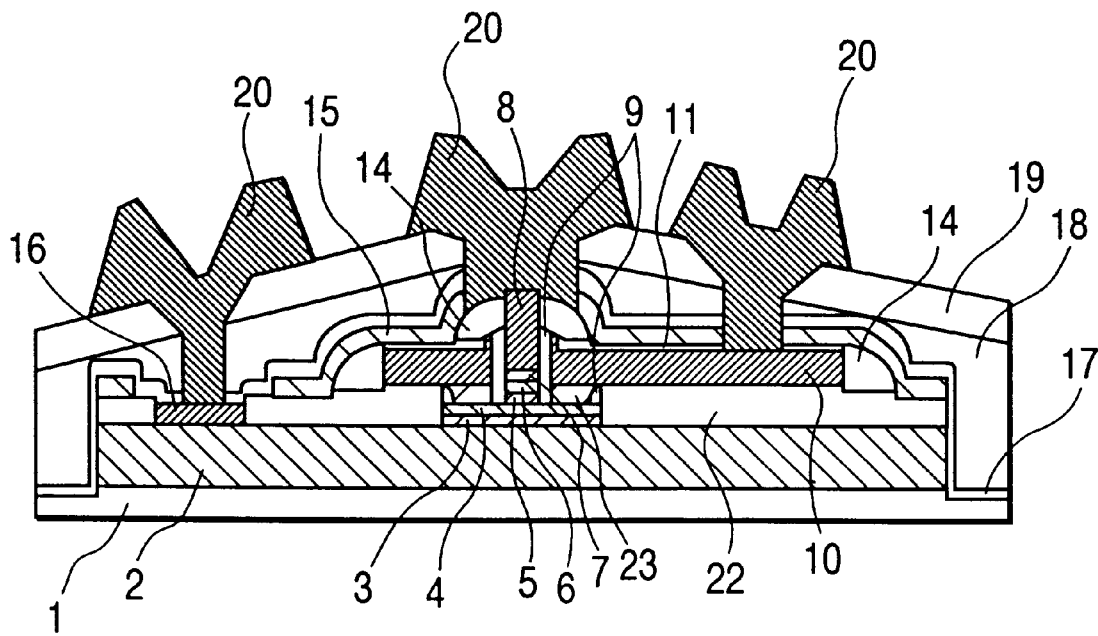

Likewise, wiring metal 20 was deposited and wired by milling on the base electrode 10 and collector electrode 16 after the formation of a contact hole, to fabricate a hetero-junction bipolar transistor. [FIG. 4(l)]

According to this Example, the GaAs layer 23 having a C concentration of $4 \times 10^{20}/cm^3$ is formed in the base lead-out area to suppress the increase in contact resistance of the base electrode, and the $SiO_2$ film 22 low in specific inductive capacity is formed in the parasitic collector region to diminish the base-collector junction area. Therefore, it is possible to fabricate a super high-speed hetero-junction bipolar transistor decreased to about one third in base-collector parasitic capacitance and increased to about 1.7 times in maximum oscillation frequency as compared with the structure of Example 1. Further, the amorphous undoped GaAs layer 15 formed in the dielectric interlayer area permits such hetero-junction bipolar transistor to be fabricated in a high process yield without causing the problems of emitter-base short-circuit and breaking of the wiring metal.

EXAMPLE 3

An AlGaAs/GaAs hetero-junction bipolar transistor in Example 3 of the present invention will now be described with reference to FIGS. 4(a), 4(e) to 4(k) and FIG. 5. In this Example, a polyimide resin film 25 still lower in specific inductive capacity than the $SiO_2$ film 22 used in Example 2 is formed in the parasitic collector region.

Figure 5A:
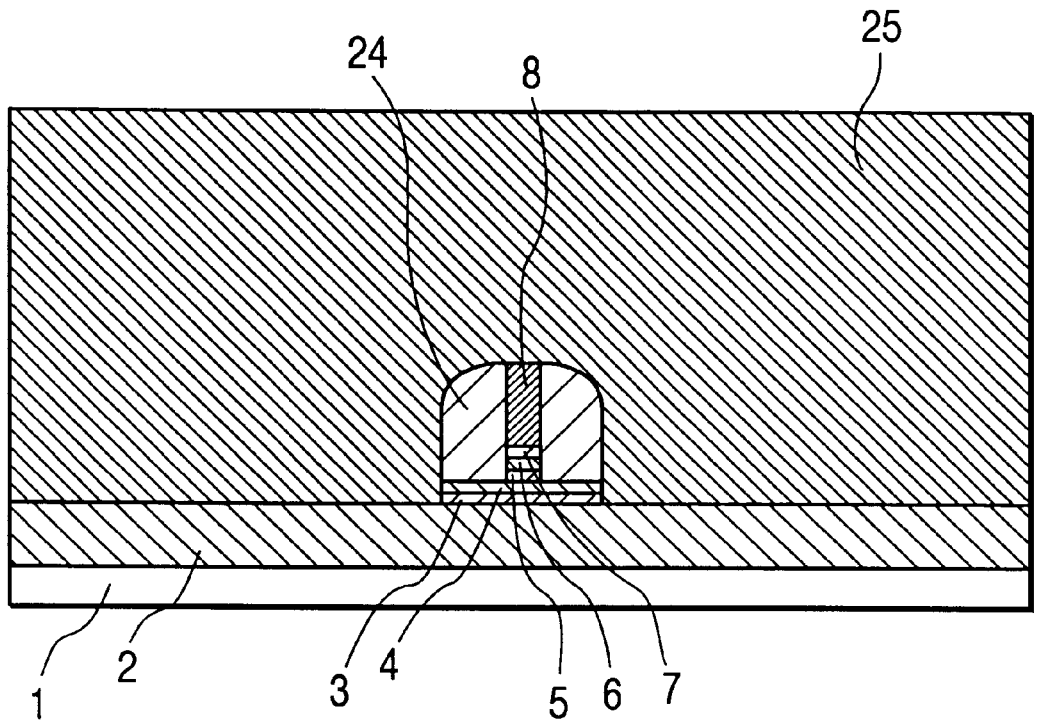
FIGS. 5(a) to 5(d) are manufacturing process diagrams for a hetero-junction bipolar transistor of Example 3 in the present invention.
Figure 5B:
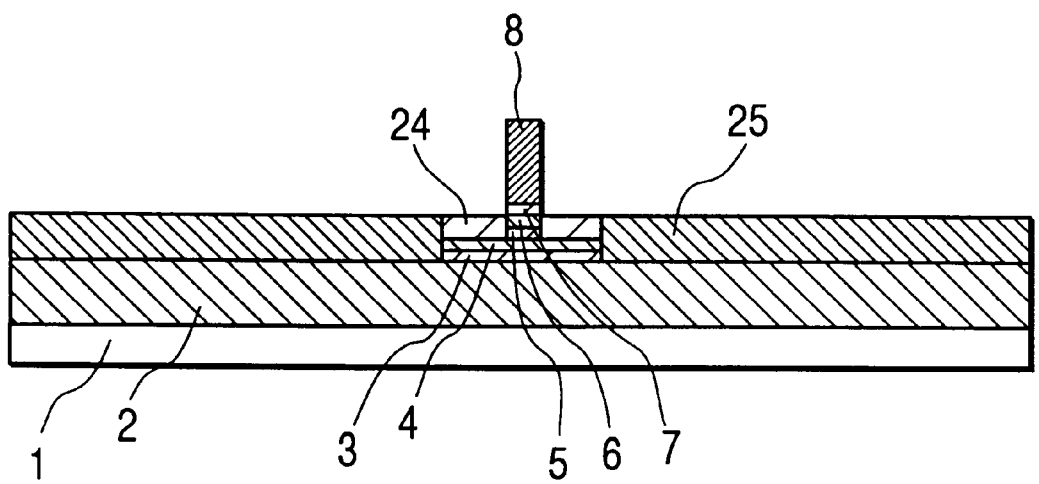
Figure 5C:
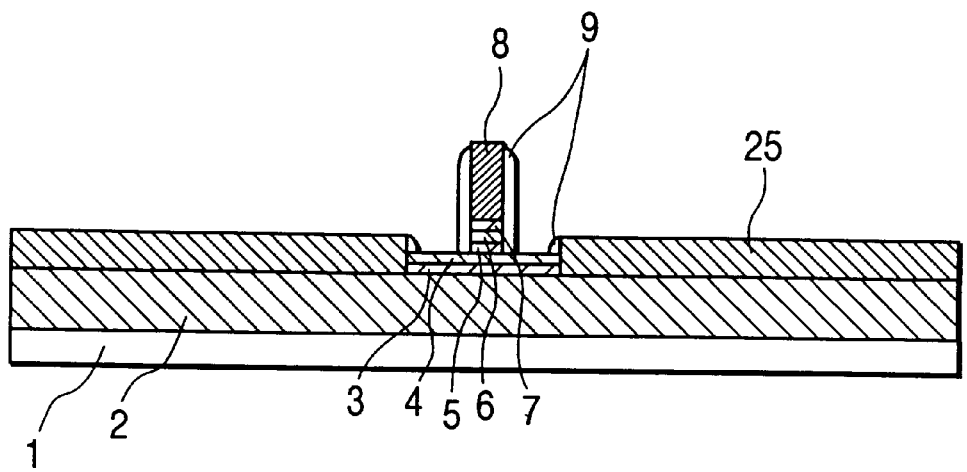

The manufacturing method of this Example is basically the same as that of Example 2 (FIG. 4), with a difference residing in that FIGS. 4(b) to 4(d) are replaced by FIGS. 5(a) to 5(c).

First, $SiO_2$ was deposited on the whole surface of the structure shown in FIG. 4(a), and $SiO_2$ side walls 24 (side wall length 0.5 μm) were formed by dry etching. Subsequently, with the $SiO_2$ side walls 24 and the emitter electrode 8 as mask, the base layer 4 and the collector layer 3 were subjected to dry etching by the ECR method in an anisotropic manner to expose the sub-collector layer 2. Then, a polyimide resin was applied to the whole surface until the surface became flat, to afford a polyimide resin film 25. [FIG. 5(a)]

Next, the polyimide resin film 25 was etched back to a thickness of 300 nm. At this time, the base layer 4 is not exposed. [FIG. 5(b)]

Then, the $SiO_2$ side walls 24 were etched off using a mixed etching solution of HF and $H_2O$ to expose the base layer 4. Thereafter, $SiO_2$ side walls 9 were formed on side faces of emitter portions 5, 6, 7, 8 and the polyimide resin film 25 by the deposition of $SiO_2$ and dry etching. The $SiO_2$ side walls 9 were 0.1 μm long and the base layer 4 was exposed sufficiently. [FIG. 5(c)]

Figure 5D:
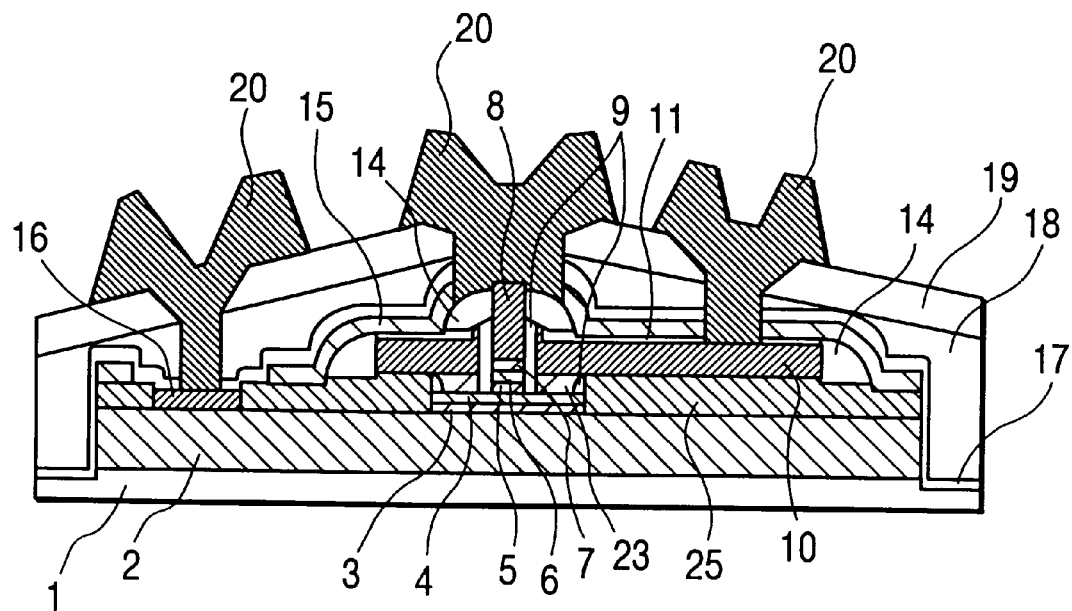

Then, the same manufacturing steps as in FIGS. 4(e) to 4(k) were followed to fabricate a hetero-junction bipolar transistor, whose completed state is illustrated in FIG. 5(d).

According to this Example, since the polyimide resin film 25 lower in specific inductive capacity than the $SiO_2$ film 22 is formed in the parasitic collector region, it is possible to fabricate a super high-speed hetero-junction bipolar transistor decreased in base-collector parasitic capacitance to about seven ninths and increased in maximum oscillation frequency to about 1.1 times as compared with the structure of Example 2. Further, the amorphous undoped GaAs layer 15 formed in the dielectric interlayer area permits such hetero-junction bipolar transistor to be fabricated in a high process yield without causing the problems of emitter-base short-circuit and breaking of the wiring metal.

EXAMPLE 4

An AlGaAs/GaAs hetero-junction bipolar transistor in Example 4 of the present invention will be described below with reference to FIGS. 4(a), 4(e) to 4(k), 5(a) to 5(c) and 6(a), 6(b).

This Example is characterized by including the step of removing the sub-collector layer 2 from the portion where the base electrode 10 is formed, before the application step of the polyimide resin film 25 illustrated in FIG. 5(a) in connection with Example 3. More specifically, this embodiment is characterized by forming $SiO_2$ side walls 24 (side wall length 0.5 μm), base layer 4 and collector layer 3 on the structure of FIG. 4(a) in the same way as in Example 3, thereafter forming a resist mask 12d partially and removing the sub-collector layer 2, allowing the substrate 1 to be exposed.

Figure 6A:
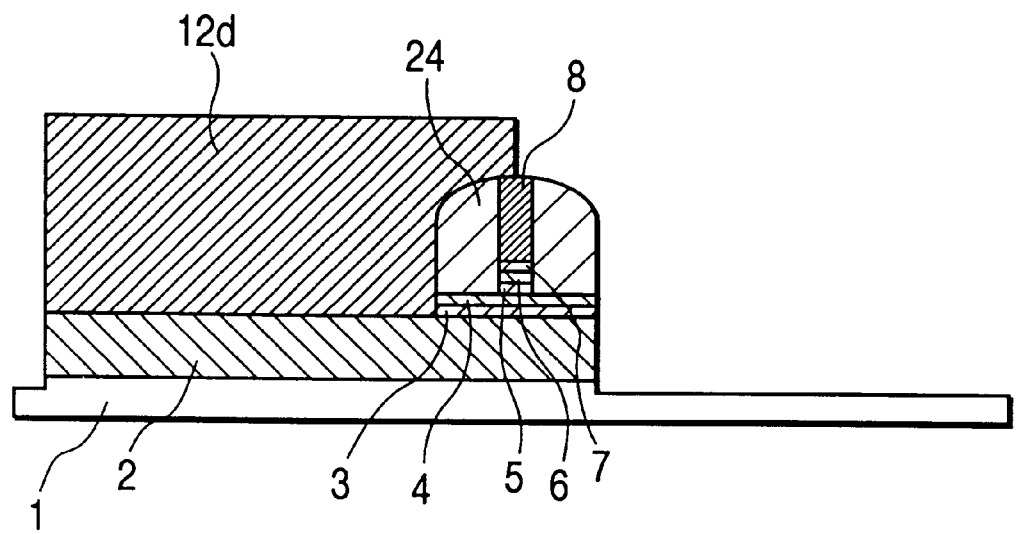
FIGS. 6(a) and 6(b) are manufacturing process diagrams for a hetero-junction bipolar transistor of Example 4 in the present invention.
Figure 6B:
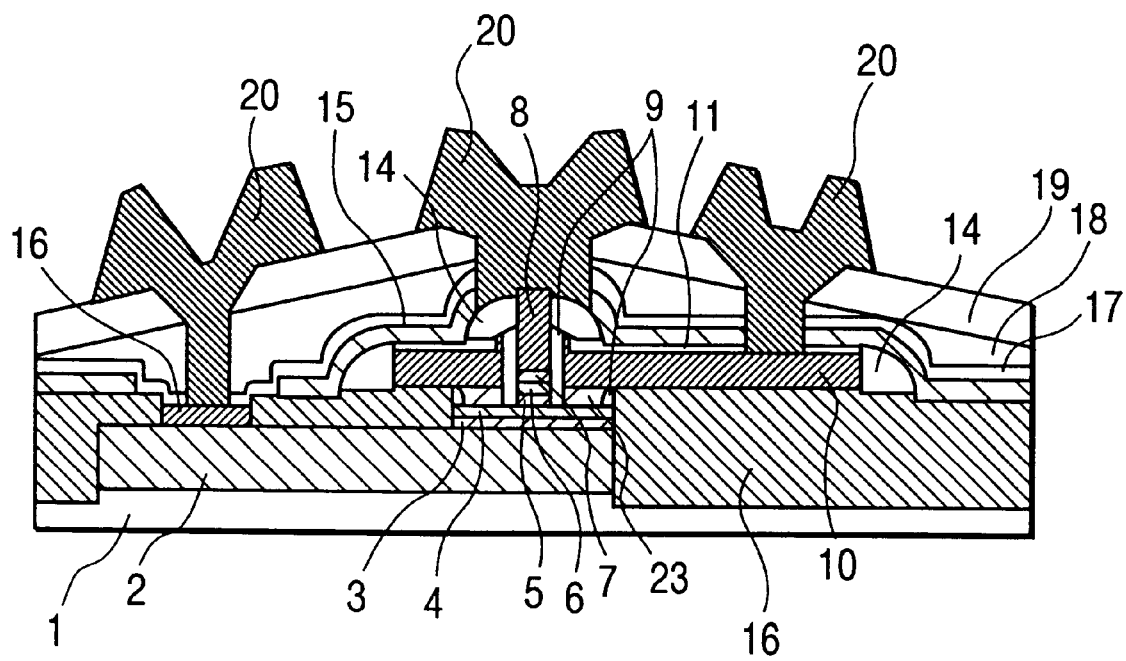

Through the same steps as FIGS. 5(a) to 5(c) and the subsequent same steps as FIGS. 4(e) to 4(k) there is completed such an AlGaAs/GaAs hetero-junction bipolar transistor as shown in FIG. 6(b).

In this Example, however, the inter-device isolation step of FIG. 4(i) is not necessary because the removal of the sub-collector layer 2 also serves as the inter-device isolation step.

According to this Example, since the polyimide resin film 25 lower in specific inductive capacity than the $SiO_2$ film 22 is formed not only in the parasitic collector region but also in the sub-collector region, it is possible to fabricate a super high-speed hetero-junction bipolar transistor decreased in base-collector parasitic capacitance to about five sevenths and increased in maximum oscillation frequency to about 1.2 times as compared with the structure of Example 3. Further, the amorphous undoped GaAs layer 15 formed in the dielectric interlayer area permits such hetero-junction bipolar transistor to be fabricated in a high process yield without causing the problems of emitter-base short-circuit and breaking of the wiring metal.

Although in Examples 1 to 4 the amorphous undoped GaAs layer 15 was formed in the dielectric interlayer area, the same layer is not always required to be amorphous, but may be polycrystalline or a mixture of amorphous and polycrystalline substances. Further, the layer in question may be a polycrystalline or amorphous compound semiconductor layer of another material, say, AlGaAs.

Although in Examples 1 to 4 reference was made to manufacturing methods for hetero-junction bipolar transistors of AlGaAs/GaAs system, there also may be used other III–V compound semiconductors such as InGaAs/InGaAs and InP/InGaAs. In this case, the structure of the base layer may utilize a two-dimensional electron gas. As to the impurity in the base layer, C may be substituted by Be. The AlAs mole ratio in the emitter layer may be selected arbitrarily in the range of 0 to 1. Although the emitter and the collector were made n-type and the base p-type, the emitter and the collector may be made p-type and the base n-type. Although the collector was formed on the substrate side and the emitter formed above, the emitter may be formed on the substrate side and the collector formed above. Although SiO2 film or polyimide resin film was used in the parasitic collector region, there may be used any other insulating film, say, $Si_3N_4$ film. Further, although GaAs(100) plane was used as the substrate, it goes without saying that there may be used any other material or crystal orientation.

EXAMPLE 5

Figure 7:
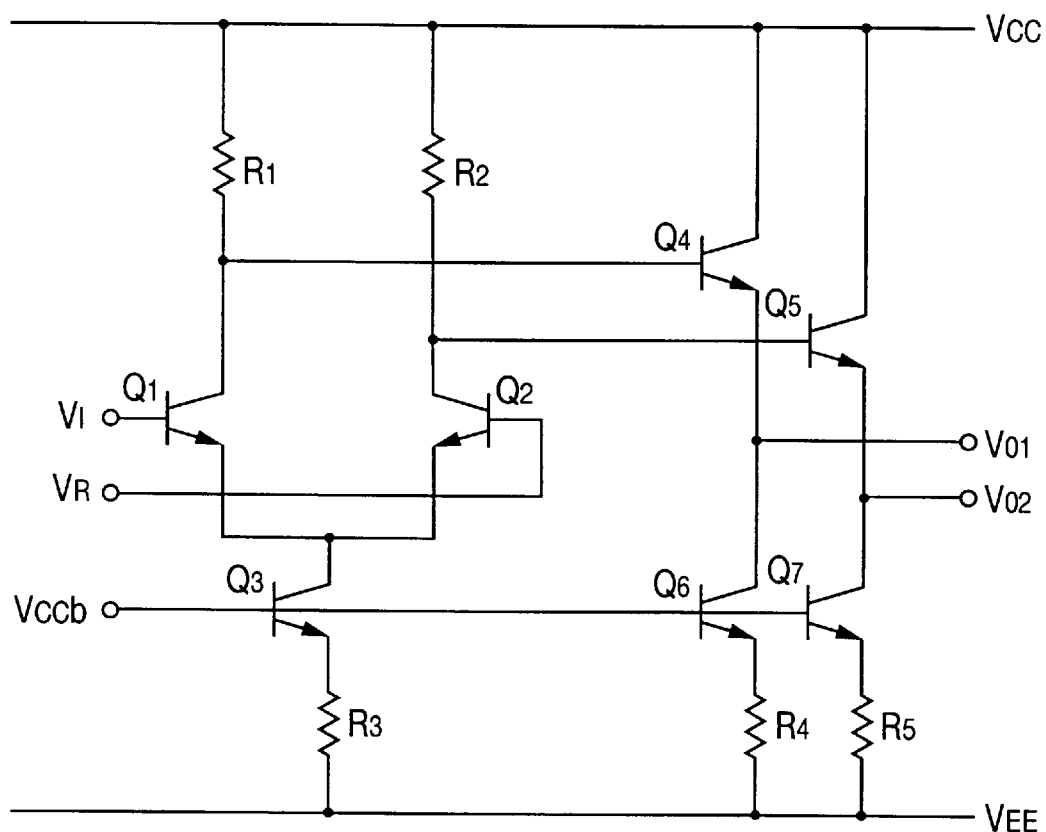
FIG. 7 is a circuit diagram of a differential amplifier circuit of Example 5 in the present invention.
Figure 8:
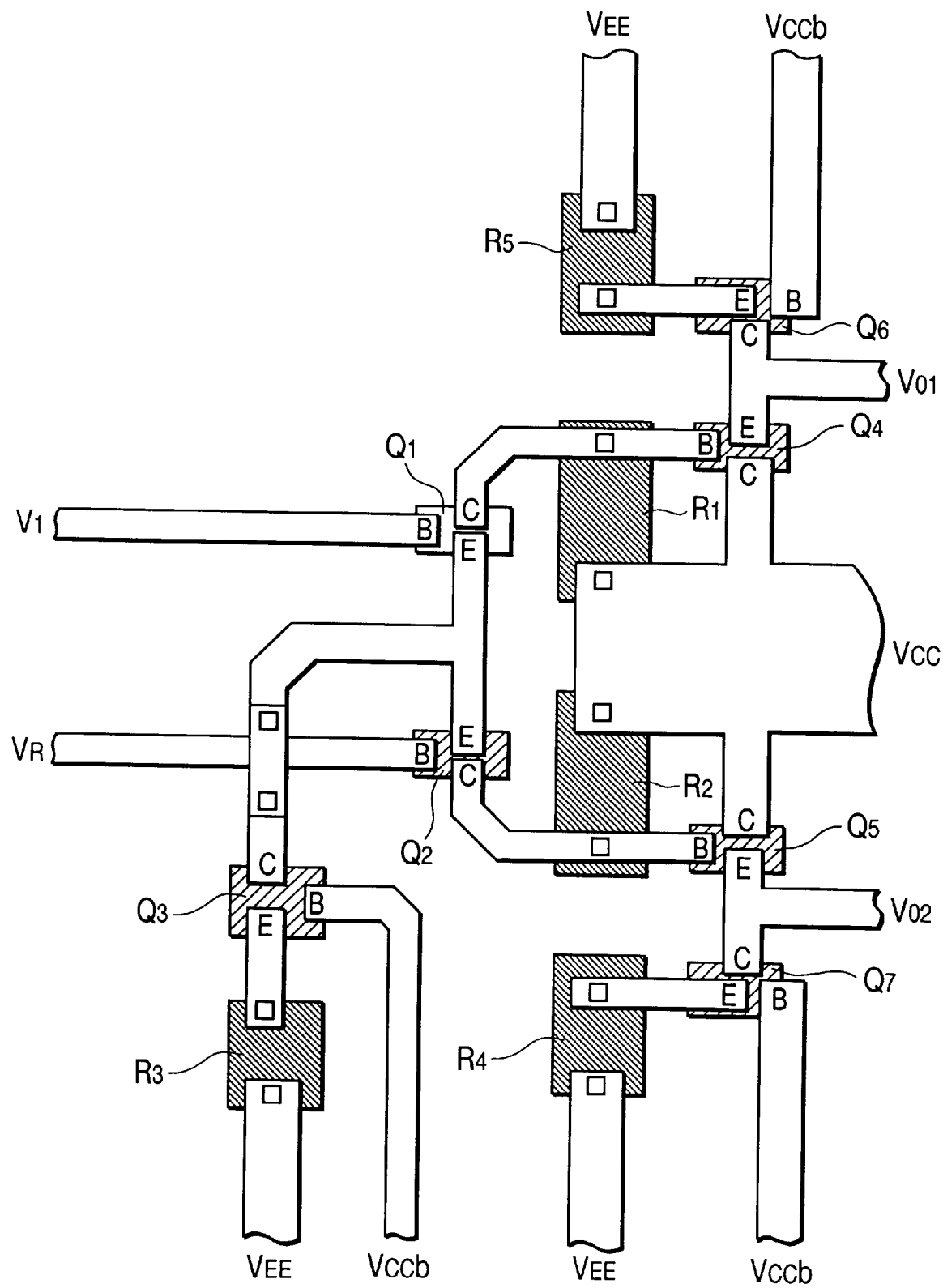
FIG. 8 is a circuit layout diagram of the differential amplifier circuit of Example 5.
Figure 9:
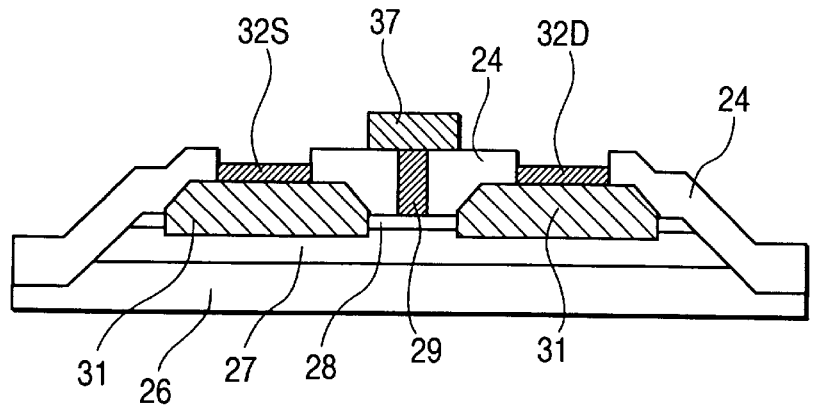
FIG. 9 is a structural sectional diagram of a conventional hetero-insulated gate field effect transistor.

A differential amplifier circuit using any of the AlGaAs/GaAs hetero-junction bipolar transistors described in Examples 1 to 4 will be described below with reference to FIGS. 7 and 8. FIG. 7 is a circuit diagram and FIG. 8 is a circuit layout diagram.

In these figures, Q1 to Q7 denote hetero-junction bipolar transistors, E, B and C in Q1 to Q7 denote emitter, base and collector, respectively, R1 to R5 denote resistors, Vi denotes an input voltage, VO1 and V02 denote output voltages, Vcc denotes a power-supply voltage, VEE denotes an earth potential, VR denotes a reference voltage, and Vccb denotes a constant voltage.

According to this Example, a differential amplifier circuit capable of performing a super high-speed operation can be realized in a high integration degree. Also, it is possible to realize an electronic circuit system using such a differential amplifier circuit as a basic unit.

Although the differential amplifier circuit of this Example uses a hetero-junction bipolar transistor of AlGaAs/GaAs system, there may be used a hetero-junction bipolar transistor of another III–V compound semiconductor such as, for example, InAlAs/InGaAs or InP/InGaAs system.

EXAMPLE 6

A hetero-insulated gate field effect transistor in Example 6 in the present invention will be described below with reference to FIG. 10.

First, a p-type GaAs layer 27 (Be concentration $3\times10^{16}/cm^3$, thickness 300 nm), a heavily doped n-type GaAs channel layer 28 (Si concentration $5\times10^{18}/cm^3$, thickness 20 nm), an undoped AlGaAs layer 28 (AlAs mole ratio 0.3, thickness 50 nm), and an undoped GaAs layer 28 (thickness 5 nm), were formed successively on an undoped GaAs(100) substrate 26 by epitaxial growth. Thereafter, by photolithography and etching, the substrate 26 was exposed to effect inter-device isolation. Subsequently, a gate electrode 29 of WSi having a height of 700 nm was formed. [FIG. 10(a)]

Next, $SiO_2$ was deposited on the whole surface, and by photolithography and dry etching, the resultant $SiO_2$ film was allowed to remain partially, including side walls 30 (side wall length 0.3 μm). With these $SiO_2$ portions as mask, the epitaxial crystal surface was etched 90 nm to expose side faces of the channel layer 28. Thereafter, in this etching area was selectively formed a heavily doped n-type GaAs layer 31 (Si concentration $4\times10^{18}/cm^3$, thickness 250 nm) for making the source and drain regions low in resistance, by a selective metal-organic chemical vapor deposition method. The heavily doped n-type GaAs layer 31 is connected to the side faces of the channel layer 28. On these layers were then formed an AuGe source electrode 32S and an AuGe drain electrode 32D. [FIG. 10(b)]

Figure 10A:
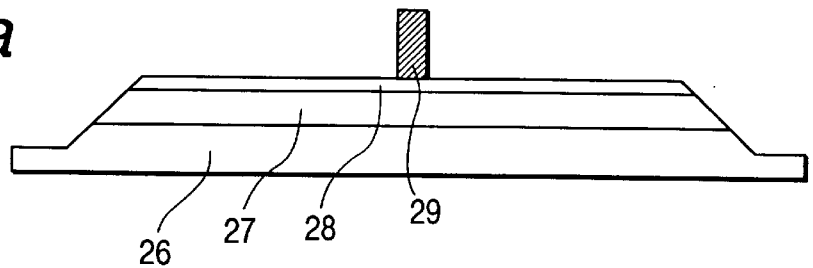
FIG. 10(a) to 10(h) are manufacturing process diagrams for a hetero-insulated gate field effect transistor of Example 6 in the present invention.
Figure 10B:
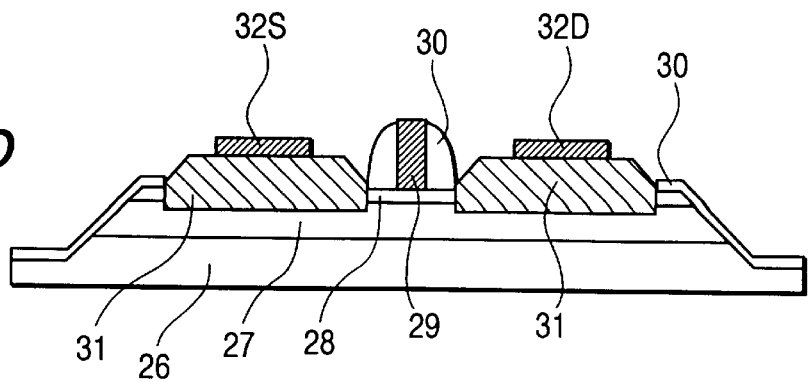
Figure 10C:
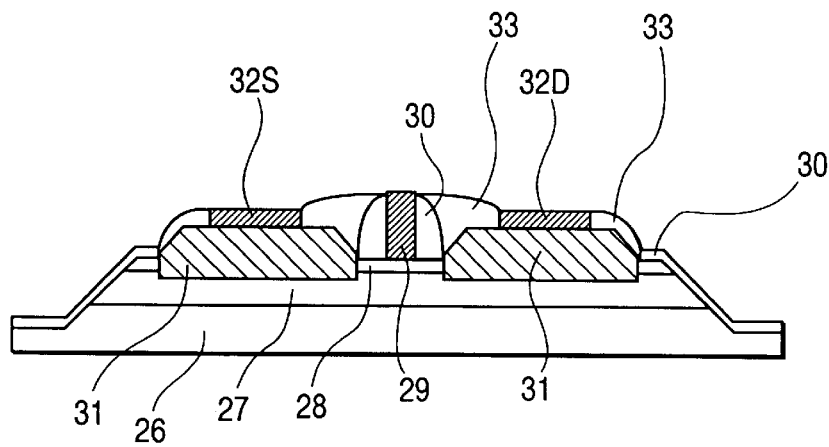

Next, $SiO_2$ was deposited on the whole surface, and $SiO_2$ side walls 33 were formed for the gate electrode 29 by dry etching. [FIG. 10(c)]

Figure 10D:
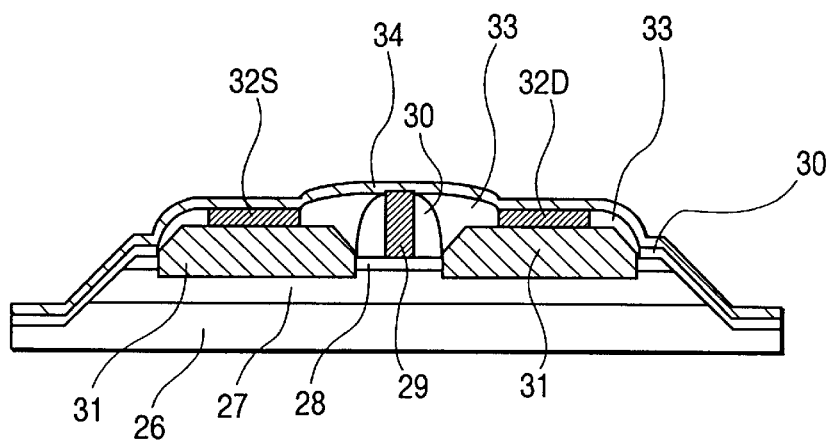

Then, within a molecular beam epitaxy system, undoped GaAs was deposited to a thickness of 50 nm at a substrate heating temperature of 350° C., affording a polycrystalline layer 34. [FIG. 10(d)]

Figure 10E:
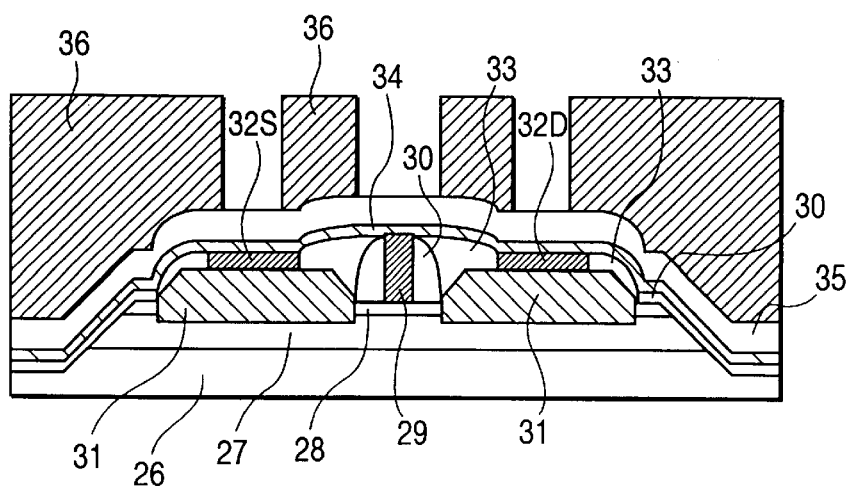

Next, $SiO_2$ film 35 was formed by deposition throughout the whole surface, and a resist mask 36 for forming contact holes was formed by photolithography. [FIG. 10(e)]

Figure 10F:
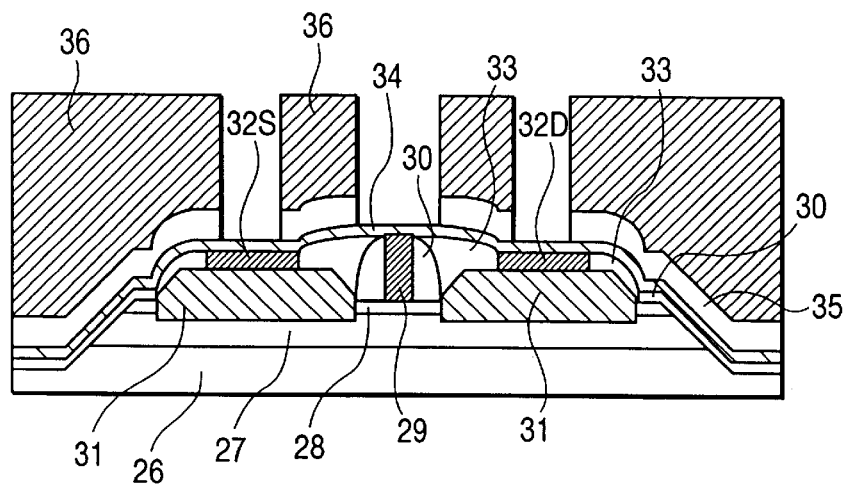
Figure 10G:
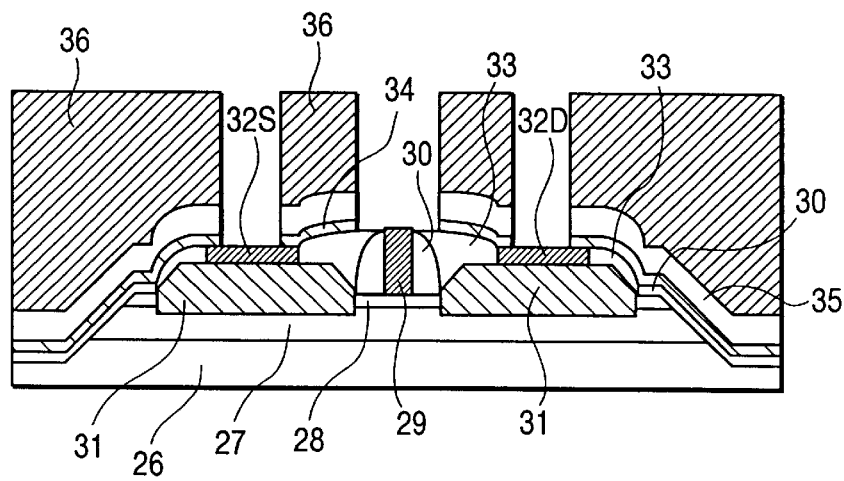

Then, the $SiO_2$ film 35 was subjected to dry etching by the RIE method using $C_2F_6$ gas and $CHF_3$ gas in a selective and anisotropic manner for the polycrystalline undoped GaAs layer 34. [FIG. 10(f)]

Next, the polycrystalline undoped GaAs layer 34 was subjected to dry etching by the ECR method using $SiCl_4$ gas in a selective and anisotropic manner for the gate electrode 29 and $SiO_2$ side walls 30, 33, allowing the gate electrode 29 to be exposed. At this time, contact holes were formed also on the source and drain electrodes in the same manner. [FIG. 10(g)]

Figure 10H:
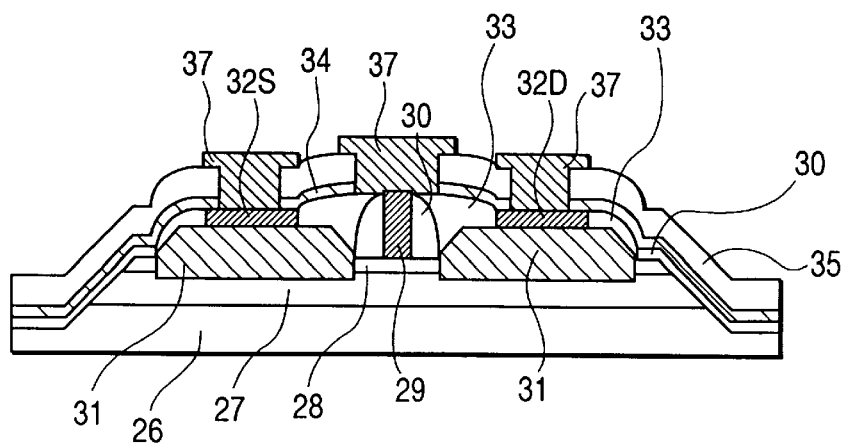

Then, wiring metal 37 as a low-resistance metal was deposited and subjected to ion milling for wiring to afford a hetero-insulated gate field effect transistor. [FIG. 10(h)]

According to this Example, a hetero-insulated gate field effect transistor can be fabricated in a high process yield without causing the problem of gate-source or gate-drain short-circuit even in the case of a fine device structure wherein the gate electrode width is 0.3 μm and the distance from the gate electrode to the source and drain regions is 0.3 μm.

Although in this Example the polycrystalline undoped GaAs layer 34 was used in the dielectric interlayer area, the same layer is not always required to be polycrystalline. It may be amorphous or a mixture of polycrystalline and amorphous substances. Further, the layer in question may be a polycrystalline or amorphous compound semiconductor of another material, say, AlGaAs. Although in this Example reference was made to a hetero-insulated gate field effect transistor, the present invention is also applicable to other field effect transistors such as HEMT (High Electron Mobility field effect Transistor), MESFET (Metal Schottky field effect Transistor), and a field effect transistor of MIS (metal-insulator-semiconductor) structure. Further, as the substrate material there may be used any of various other materials, including compound semiconductors and single-element semiconductors, say, Si semiconductor.

EXAMPLE 7

Figure 11:
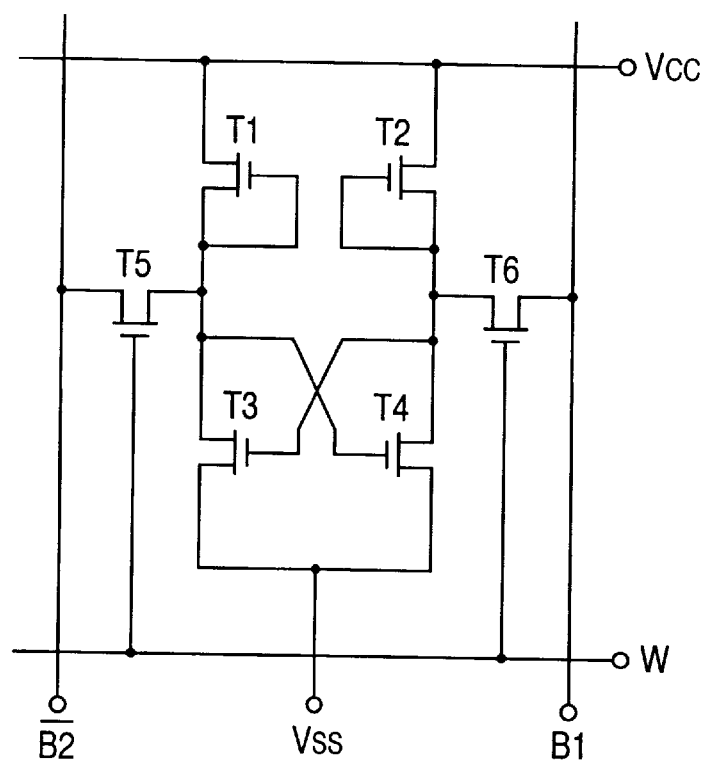
FIG. 11 is a circuit diagram of a static type random access memory cell of Example 7 in the present invention.

A static type random access memory cell using the hetero-insulated gate field effect transistor of Example 6 will be described below with reference to FIG. 11 which is a circuit diagram of the memory cell.

T1 to T6 denote hetero-insulated gate field effect transistors, Vcc denotes a power-supply potential, Vss denotes an earth potential, W denotes a word line, and B1 and B2 denote bit lines. The voltage of B1 and that of B2 are opposite in polarity.

According to this Example a highly reliable memory cell circuit can be realized in a high integration degree, and it is also possible to fabricate an electronic circuit system using such memory cell circuit as a basic unit.

EXAMPLE 8

Figure 12:
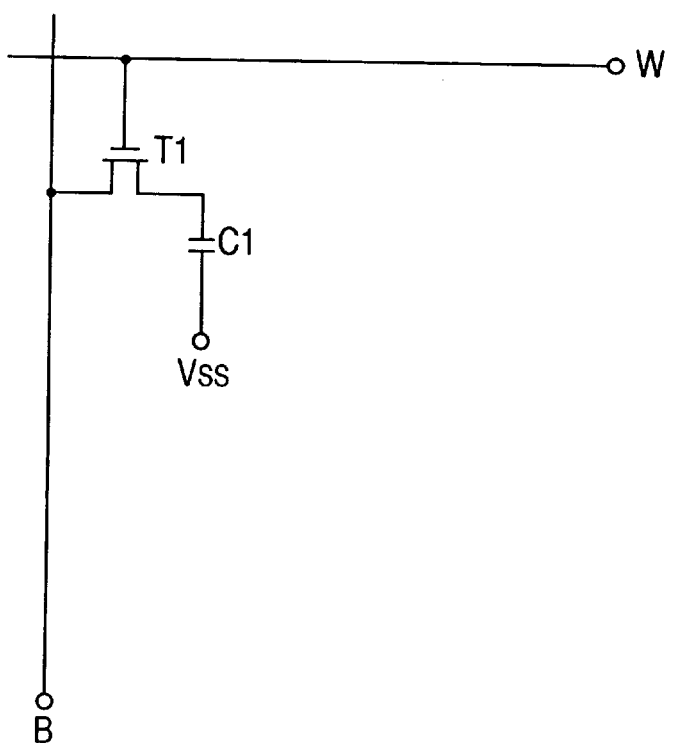
FIG. 12 is a circuit diagram of a dynamic type random access memory cell of Example 8 in the present invention.

A dynamic type random access memory cell using the hetero-insulated gate field effect transistor of Example 6 will be described below with reference to FIG. 12 which is a circuit diagram of the memory cell.

T1 denotes a hetero-insulated field effect transistor, C1 denotes a capacitor for storage, Vss denotes an earth potential, W denotes a word line, and B denotes a bit line.

According to this Example a highly reliable memory cell circuit can be fabricated in a high integration degree, and it is also possible to fabricate an electronic circuit system using such memory cell circuit as a basic unit.

Although in each of Examples 7 and 8 was described a memory cell circuit using hetero-insulated field effect transistor, it goes without saying that there may be used any other field effect transistor.

EXAMPLE 9

An optical transmission system as a communication system using any of the AlGaAs/GaAs hetero-junction bipolar transistors shown in Examples 1 to 4 will be described below with reference to FIGS. 13 and 14.

Figure 13:
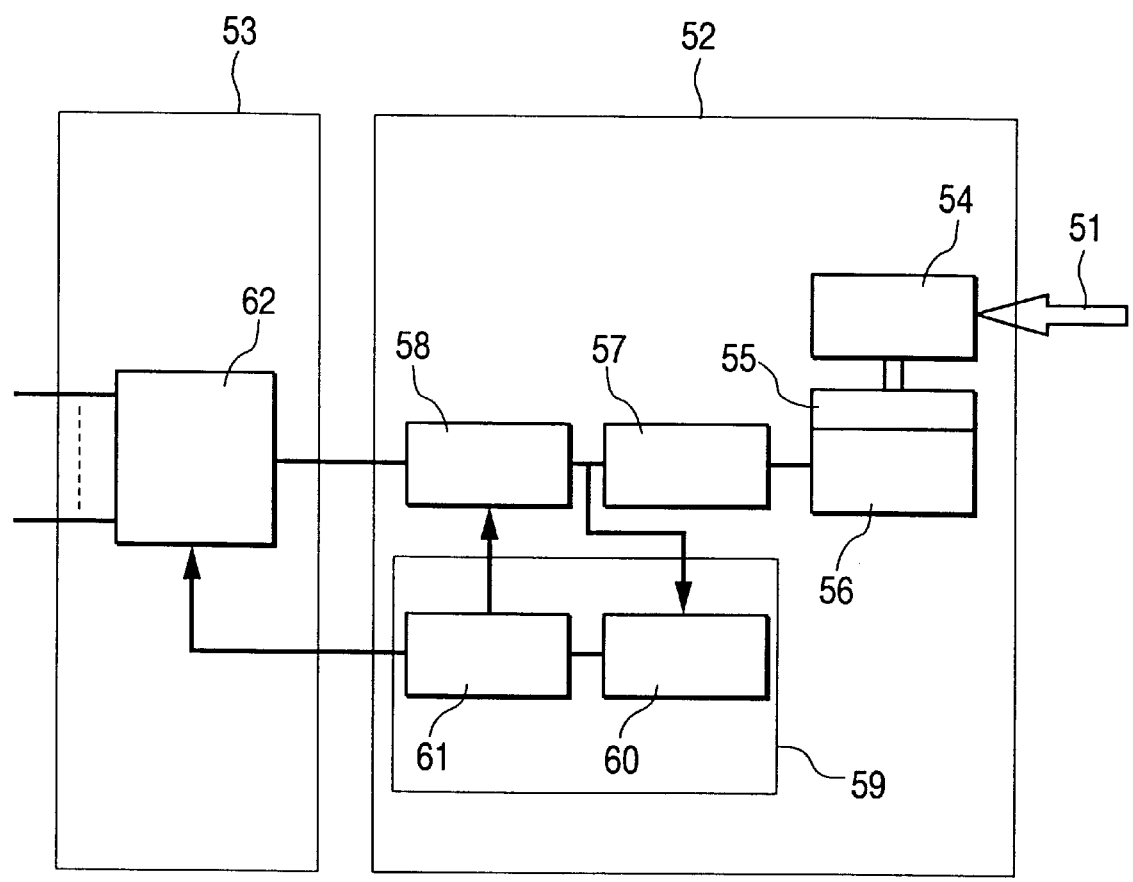
FIG.13 is a block diagram of a receiver including some optical devises.

FIG. 13 illustrates a receiver. The receiver includes an optical signal 51 as a composite signal of plural data signals, a PIN-photodiode 55 for converting the optical signal 51 into an analog electric signal, an auto gain control (AGC) amplifier 57 for amplifying the analog electric signal, a decision circuit 58 for converting the amplified analog electric signal into a digital electric signal, a demultiplexer (DMUX) 62 for the digital electric signal, and a timing extraction circuit 59 which outputs a timing clock to both decision circuit 58 and DMUX 62.

The preamplifier 56, AGC amplifier 57, decision circuit 58, rectifier 60 and limiting amplifier 61 are constituted using the differential amplifier of Example 5 as a basic circuit. In particular, the application of the semiconductor device according to the present invention to the AGC amplifier 57 is effective.

Figure 14:
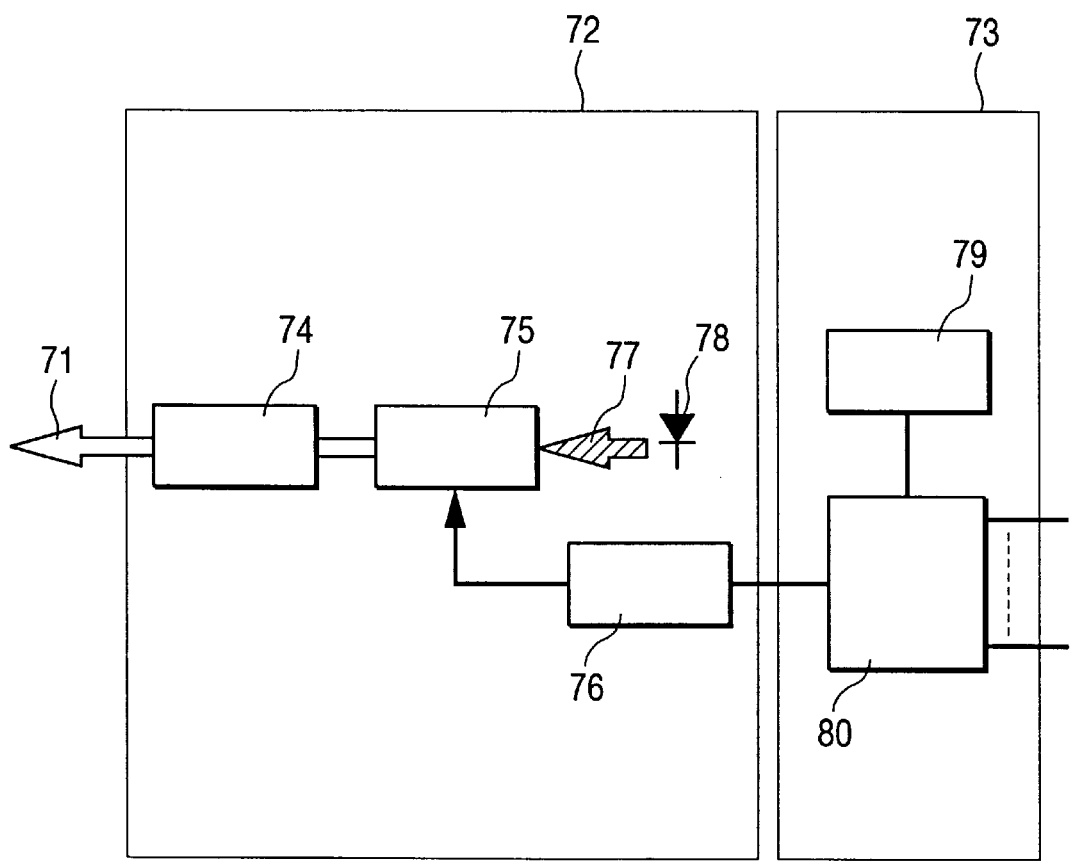
FIG. 14 is a block diagram of transmitter including a multiplexer.

FIG. 14 illustrates a transmitter. The transmitter includes a multiplexer (MUX) 80 for converting plural digital electric signals into a composite digital signal, an optical modulator driver 76 for amplifying the composite digital signal, a laser diode 78 for generating a laser beam 77, an optical modulator 75 for modulating the laser beam in accordance with the amplified composite digital signal, and an optical signal 71 outputted from the optical modulator 75.

The optical modulator 75 and the optical modulator driver 76 are each constituted by using any of the AlGaAs/GaAs hetero-junction bipolar transistors shown in Examples 1 to 4. In particular, the application of the semiconductor device according to the present invention to the optical modulator driver 76 is effective.

According to this Example, the optical receiver and the optical transmitter can each be constituted by using a hetero-junction bipolar transistor small in both emitter-base capacitance and base-collector capacitance and large in maximum oscillation frequency. Therefore, it is possible to provide a communication system capable of operating at a super high speed.

Although in this Example there was used an AlGaAs/GaAs hetero-junction bipolar transistor, there can be obtained just the same effect even with use of a hetero-junction bipolar transistor constituted by any of other III–V compound semiconductors such as InGaP/GaAs and InP/InGaAs. Also, it goes without saying that there may be used such as the field effect transistor of Example 6.

The present invention is also applicable to other semiconductor devices such as light emitting devices and light receiving devices than those described in the above Examples, and further applicable to integrated circuits and electronic circuits using such semiconductor devices.

What is claimed is:

1. A semiconductor device including:
    a single crystal semiconductor layer;
    a first conductor layer formed on said single crystal semiconductor layer;
    a first dielectric layer formed on each side face of said first conductor layer;
    a first semiconductor layer of a polycrystalline or amorphous undoped III–V compound semiconductor, or an alloy thereof, formed on said first dielectric layer and having a through hole to which are exposed at least part of said first conductor layer and said first dielectric layer; and
    a second conductor layer formed in contact with said first conductor layer within said through hole.

2. A semiconductor device according to claim 1, wherein said III–V compound semiconductor is GaAs.

3. A semiconductor device according to claim 1, wherein said single crystal semiconductor layer includes collector, base and emitter regions of a bipolar transistor, said first conductor layer is a collector electrode or an emitter electrode, and which further includes a second dielectric layer formed on said first semiconductor layer, said second dielectric layer having a through hole whose inner peripheral shape is substantially coincident with that of the through hole formed in said first semiconductor layer.

4. A semiconductor device according to claim 3, wherein said III–V compound semiconductor is GaAs.

5. A semiconductor device according to claim 3, wherein said first conductor layer is an emitter electrode, said single crystal semiconductor layer further includes a sub-collector region formed on said collector region on the side opposite to said base region, the collector region and the base region are smaller than said sub-collector region, said emitter region is smaller than the collector region and the base region, and which further includes a third dielectric layer formed in contact with said sub-collector, collector and base regions and having a through hole on said base region, a base lead-out semiconductor layer of the same conductivity type as said base region, said base lead-out semiconductor layer being formed in contact with the base region within the through hole of said third dielectric layer, and a base electrode formed in contact with said base lead-out semiconductor layer and extending onto said third dielectric layer.

6. A semiconductor device according to claim 5, wherein said III–V compound semiconductor is GaAs.

7. A semiconductor device according to claim 5, wherein said bipolar transistor is a hetero-junction bipolar transistor constituted by a compound semiconductor and whose emitter-base junction is a hetero-junction, and said base lead-out semiconductor layer is constituted by a compound semiconductor layer.

8. A semiconductor device according to claim 7, wherein said III–V compound semiconductor is GaAs.

9. A semiconductor device according to claim 1, wherein said single crystal semiconductor layer includes a channel area of a field effect transistor, said first conductor layer is a gate electrode, and which further includes a second dielectric layer formed on said first semiconductor layer, said second dielectric layer having a through hole whose inner peripheral shape is substantially coincident with that of the through hole formed in said first semiconductor layer.

10. A semiconductor device according to claim 9, wherein said III–V compound semiconductor is GaAs.

11. A semiconductor device according to claim 9, wherein said field effect transistor is constituted by a compound semiconductor.

12. A semiconductor device according to claim 11, wherein said III–V compound semiconductor is GaAs.

13. A semiconductor device having a structure of a bipolar transistor wherein sub-collector region, collector region, base region and emitter region are laminated in this order, said collector region and said base region being smaller than said sub-collector region, said emitter region being smaller than said collector region and said base region, said semiconductor device further including a dielectric layer formed in contact with said sub-collector, collector and base regions and having a through hole on said base region, a base lead-out semiconductor layer of the same conductivity type as said base region, said base lead-out semiconductor layer being formed in contact with said base region within the through hole of said dielectric layer, and a base electrode formed in contact with said base lead-out semiconductor layer and extending onto said dielectric layer, wherein said dielectric layer is in contact with an upper surface of said sub-collector.

14. A semiconductor device including a dielectric layer and a semiconductor layer of a polycrystalline or amorphous undoped III–V compound semiconductor or an alloy thereof, with a through hole being formed in said semiconductor layer, wherein said dielectric layer is exposed to said through hole.

15. A semiconductor device according to claim 14, wherein said III–V compound semiconductor is GaAs.

16. A communication system including:
   an opto-electric transducer for converting an optical signal as a composite signal of plural data signals into an analog electric signal;
   an auto gain control amplifier for amplifying said analog electric signal;
   a decision circuit for converting the amplified analog electric signal into a digital electric signal;
   a demultiplexer for demultiplexing said digital electric signal into a signal based on said data signal; and
   a timing extraction circuit which, upon receipt of the amplified analog electric signal, outputs a timing clock for extracting the signal based on the data signal to said decision circuit and said demultiplexer,
   wherein at least one of said AGC amplifier, said decision circuit and said timing extraction circuit has the semiconductor device described in any of claims 3 to 12.

17. A communication system including:
   a plurality of digital electric signals;
   a multiplexer for converting said digital electric signals into a composite digital electric signal;
   an optical modulator driver for amplifying said composite digital signal; and
   an optical modulator for modulating a laser beam emitted from a laser diode and converting said composite digital signal into an optical signal,
   wherein at least one of said optical modulator and said optical modulator driver has the semiconductor device described in any of claims 3 to 12.

18. An electric circuit system comprising:
   a differential amplifier and said differential amplifier having the semiconductor device described in any one of claims 3 to 12.

19. A semiconductor device including a dielectric Si compound layer, and a semiconductor layer of a polycrystalline or amorphous undoped III–V compound semiconductor or an alloy thereof as a dielectric interlayer, with a through hole being formed in said semiconductor layer, wherein said dielectric Si layer is exposed to said through hole.

20. A semiconductor device according to claim 1, wherein the first dielectric layer includes Si.

21. A semiconductor device according to claim 20, wherein the first dielectric layer is an Si compound.

22. A semiconductor device according to claim 3, wherein the first and second dielectric layers each include Si.

23. A semiconductor device according to claim 22, wherein the first and second dielectric layers are each comprised of a Si compound.

24. A semiconductor device according to claim 9, wherein the first and second dielectric layers each include Si.

25. A semiconductor device according to claim 24, wherein the first and second dielectric layers are each comprised of a Si compound.

26. A semiconductor device according to claim 13, wherein the dielectric layer includes Si.

27. A semiconductor device according to claim 26, wherein said dielectric layer is comprised of an Si compound.

28. A semiconductor device according to claim 14, wherein the dielectric layer includes Si.

29. A semiconductor device according to claim 28, wherein said dielectric layer is comprised of an Si compound.

30. A communication system including:
- an opto-electric transducer for converting an optical signal as a composite signal of plural data signals into an analog electric signal;
- an auto gain control amplifier for amplifying said analog electric signal;
- a decision circuit for converting the amplified analog electric signal into a digital electric signal;
- a demultiplexer for demultiplexing said digital electric signal into a signal based on said data signal; and
- a timing extraction circuit which, upon receipt of the amplified analog electric signal, outputs a timing clock for extracting the signal based on the data signal to said decision circuit and said demulitplexer,
- wherein at least one of said AGC amplifier, said decision circuit and said timing extraction circuit has the semiconductor device described in claim 13.

31. A communication system including:
- a plurality of digital electric signals;
- a multiplexer for converting said digital electric signals into a composite digital electric signal;
- an optical modulator driver for amplifying said composite digital signal; and
- an optical modulator for modulating a laser beam emitted from a laser diode and converting said composite digital signal into an optical signal,
- wherein at least one of said optical modulator and said optical modulator driver has the semiconductor device described in claim 13.

32. An electric circuit system comprising:
- a differential amplifier and said differential amplifier having the semiconductor device described in claim 13.

* * * * *